(12) United States Patent
Hamada et al.

(10) Patent No.: US 7,265,234 B2
(45) Date of Patent: Sep. 4, 2007

(54) SILSESQUIOXANE COMPOUND MIXTURE, METHOD OF MAKING, RESIST COMPOSITION, AND PATTERNING PROCESS

(75) Inventors: Yoshitaka Hamada, Joetsu (JP); Mutsuo Nakashima, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/393,911

(22) Filed: Mar. 31, 2006

(65) Prior Publication Data

US 2006/0224009 A1 Oct. 5, 2006

(30) Foreign Application Priority Data

Apr. 1, 2005 (JP) .............................. 2005-105783
Apr. 1, 2005 (JP) .............................. 2005-105795

(51) Int. Cl.
*C07F 7/00* (2006.01)
*G03C 1/76* (2006.01)

(52) U.S. Cl. .................................. 556/466; 430/270.1

(58) Field of Classification Search ..................... None
See application file for complete search history.

(56) References Cited

U.S. PATENT DOCUMENTS

| 4,130,599 | A | 12/1978 | Merrill et al. |
| 5,714,625 | A | 2/1998 | Hada et al. |
| 6,063,953 | A | 5/2000 | Hada et al. |
| 6,261,738 | B1 | 7/2001 | Asakura et al. |
| 6,972,312 | B1 | 12/2005 | Lichtenhan et al. |
| 2004/0137241 | A1 | 7/2004 | Lin et al. |
| 2001/0241579 | | 12/2004 | Hamada et al. |
| 2004/0241579 | A1 | 12/2004 | Hamada et al. |

FOREIGN PATENT DOCUMENTS

| JP | 9-95479 | 4/1997 |
| JP | 9-208554 | 8/1997 |
| JP | 9-230588 | 9/1997 |
| JP | 9-301948 | 11/1997 |
| JP | 29006999 | 6/1999 |
| JP | 2000-314956 | 11/2000 |
| JP | 2003-510337 | 3/2003 |
| JP | 2004-212983 | 7/2004 |
| JP | 2004-354417 | 12/2004 |
| WO | WO 01/10871 | 2/2001 |
| WO | WO 01/46295 A1 | 6/2001 |

OTHER PUBLICATIONS

European Search Report dated Aug. 23, 2006, issued in the corresponding European Application No. 06251845.1.
K. Arimitsu et al.; "Sensitivity Enhancement of Chemical-Amplification-Type Photoimaging Materials by Acetoacetic Acid Derivatives"; Journal of Photopolymer Science and Technology, vol. 8, No. 1, 1995; pp. 43-44.
K. Kudo et al.; "Enhancement of the Sensitivity of Chemical-Ampliciation-Type Photoimaging Materials by β-Tosyloxyketone Acetals"; Journal of Photopolymer Science and Techonology, vol. 8, No. 1, 1995; pp. 45-46.
K. Arimitsu et al.; "Effect of Phenolic Hydroxyl Residues on the Improvement of Acid-Proliferation-Type Photoimaging materials"; Journal of Photopolymer Science and Techonology, vol. 9, No. 1, 1996; pp. 29-30.

*Primary Examiner*—Thurman K. Page
*Assistant Examiner*—MLouisa Lao
(74) *Attorney, Agent, or Firm*—Westerman, Hattori, Daniels & Adrian, LLP.

(57) ABSTRACT

A silsesquioxane compound mixture having a high proportion of silsesquioxane compounds bearing bulky substituent groups on side chain and having a degree of condensation of substantially 100% is prepared by a first stage wherein a silane feed comprising a trifunctional silane bearing a bulky substituent group on side chain represented by formula (1):

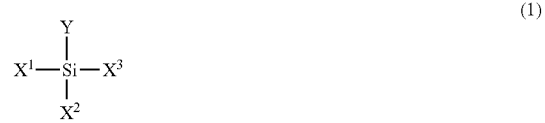

(1)

wherein Y is an aliphatic or aromatic organic group optionally having a functional group, $X^1$, $X^2$ and $X^3$ are H, halogen, alkoxy or aryloxy is hydrolyzed in the presence of an acid or base catalyst, and a second stage wherein dehydrating condensation is carried out in the presence of a strong base catalyst while removing the water resulting from condensation out of the reaction system.

6 Claims, 4 Drawing Sheets

A: EXAMPLE 1   B: EXAMPLE 2   C: EXAMPLE 3

SILSESQUIOXANE COMPOUND MIXTURE, METHOD OF MAKING, RESIST COMPOSITION, AND PATTERNING PROCESS

CROSS-REFERENCE TO RELATED APPLICATION

This non-provisional application claims priority under 35 U.S.C. §119(a) on Patent Application Nos. 2005-105783 and 2005-105795 filed in Japan on Apr. 1, 2005 and Apr. 1, 2005, respectively, the entire contents of which are hereby incorporated by reference.

FIELD OF THE INVENTION

The present invention relates to a method for preparing a silsesquioxane compound mixture containing a higher proportion of silsesquioxane compounds bearing bulky substituent groups on side chain and having a degree of condensation of substantially 100% (meaning the substantial absence of silanol groups (OH groups) on silicon atoms). It also relates to a silsesquioxane compound mixture suitable as a base resin in a positive resist composition, especially a chemically amplified positive resist composition, for micropatterning in the fabrication of semiconductor devices or the like. It also relates to a positive resist composition, especially a chemically amplified positive resist composition, and a patterning process suited for the fabrication of microelectronic devices by photolithography using as a light source high-energy radiation such as deep-UV, KrF excimer laser (248 nm), ArF excimer laser (193 nm), F2 laser (157 nm), electron beam, and x-ray. Herein, silsesquioxane is sometimes referred to as SSQ.

BACKGROUND ART

In the drive for higher integration and operating speeds in LSI devices, the pattern rule is made drastically finer. Under the miniaturizing trend, the lithography has achieved formation of finer patterns by using a light source with a shorter wavelength and by a choice of a proper resist composition for the shorter wavelength. Predominant among others are positive resist compositions which are used as a single layer. These single layer positive resist compositions are based on resins possessing a structure having resistance to etching with chlorine or fluorine gas plasma and provided with a resist mechanism that exposed areas become dissolvable. Typically, the resist composition is coated on a patternable substrate and exposed to a pattern of light, after which the exposed areas of the resist coating are dissolved to form a pattern. Then, the patternable substrate can be processed by etching with the remaining resist pattern serving as an etching mask.

In an attempt to achieve a finer feature size, i.e., to reduce the pattern width with the thickness of a resist film kept unchanged, the resist film becomes low in resolution performance, and if the resist film is developed with a liquid developer to form a pattern, the so-called "aspect ratio" (depth/width) of the resist pattern becomes too high, resulting in pattern collapse. For this reason, the miniaturization is accompanied by a thickness reduction of the resist film (thinner film). On the other hand, with the progress of the exposure wavelength toward a shorter wavelength, the resin in resist compositions is required to have less light absorption at the exposure wavelength. In response to changes from i-line to KrF and to ArF, the resin has made a transition from novolac resins to polyhydroxystyrene and to acrylic resins. Actually, the etching rate under the above-indicated etching conditions has been accelerated. This suggests the inevitableness that a patternable substrate is etched through a thinner resist film having weaker etching resistance. It is urgently required to endow the resist film with etching resistance.

Meanwhile, a process known as multilayer resist process was developed in the art for processing a patternable substrate by etching. The process uses a resist film which has weak etching resistance under the etching conditions for the substrate, but is capable of forming a finer pattern, and an intermediate film which has resistance to etching for processing the substrate and can be patterned under the conditions to which the resist film is resistant. Once the resist pattern is transferred to the intermediate film, the substrate is processed by etching through the pattern-transferred intermediate film as an etching mask. A typical process uses a silicon-containing resin as the resist composition and an aromatic resin as the intermediate film. In this process, after a pattern is formed in the silicon-containing resin, oxygen-reactive ion etching is carried out. Then the silicon-containing resin is converted to silicon oxide having high resistance to oxygen plasma etching, and at the same time, the aromatic resin is readily etched away where the etching mask of silicon oxide is absent, whereby the pattern of the silicon-containing resin is transferred to the aromatic resin layer. Unlike the single layer resist film, the aromatic resin need not have light transmittance at all, allowing for use of a wide variety of aromatic resins having high resistance to etching with fluorine or chlorine gas plasma. Using the aromatic resin as the etching mask, the patternable substrate can be etched with fluorine or chlorine gas plasma.

Typical resins used in the bilayer resist process are polysilsesquioxanes. In chemically amplified resist compositions of negative type, polysilsesquioxane having side chains exhibiting solubility in alkaline developer is typically used in combination with crosslinkers and photoacid generators. In chemically amplified resist compositions of positive type, polysilsesquioxane having acidic side chains protected with acid labile groups is typically used in combination with photoacid generators. In general, the polysilsesquioxanes are prepared through condensation reaction of trifunctional silane monomers. Since an ordinary synthesis method yields a polysilsesquioxane product with a noticeable amount of silanol groups left therein, compositions containing the same suffer from shelf instability.

Cage silsesquioxanes are typical of silsesquioxanes (SSQ) which are substantially free of silanol groups, that is, have a degree of condensation of substantially 100%. In general, polyhedral oligomeric silsesquioxanes of 6 to 12 monomer units are known and abbreviated as POSS, of which an oligomer of 8 monomer units (referred to as octet) is relatively readily available. Patternable material using POSS compound is described in US Patent Application 2004-0137241 A1 (JP-A 2004-212983). A resist composition is synthesized by starting with a POSS compound having hydrogen as substituent groups and introducing side chains therein.

For SSQ compounds having a degree of condensation of 100%, exemplary frameworks include those of 6 to 12 monomer units shown below.

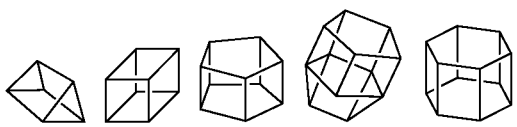

Herein, each apex denotes a silicon atom having one substituent group, and each side denotes a Si—O—Si linkage.

Meanwhile, condensates (SSQ) of alkyl-bearing trifunctional silicon compounds are attractive as organic-inorganic composites and have found a wide range of actual application, for example, as base polymer in the bilayer resist process. Regrettably, they lack shelf stability because hydrolyzable silanol or alkoxy groups are left behind as described above. An improvement in shelf stability is desired. With respect to the octet (POSS compound) having a degree of condensation of 100% having the ultimate structure, shown below, which is expected as the material capable of solving shelf instability, several reports were already published and their preparation methods are known. In most of these methods, equilibration reaction is carried out in the presence of a base catalyst over a long time. For utilizing the high crystallinity of the octet having a degree of condensation of 100%, an appropriate solvent is selected as the reaction medium so that the octet may be crystallized and isolated from the system. In this case, although a shift of equilibrium occurs as a result of the product or octet having a degree of condensation of 100% being crystallized and removed out of the reaction system, condensation generally proceeds to a full extent even under the condition that water is co-present in the reaction system. Then a starting substance having a relatively small substituent group enough to form an octet must be selected. Since isolation and purification depends on a level of crystallization, the substituent group that can be introduced is restricted. Complex steps are necessary to introduce substituent groups of different type.

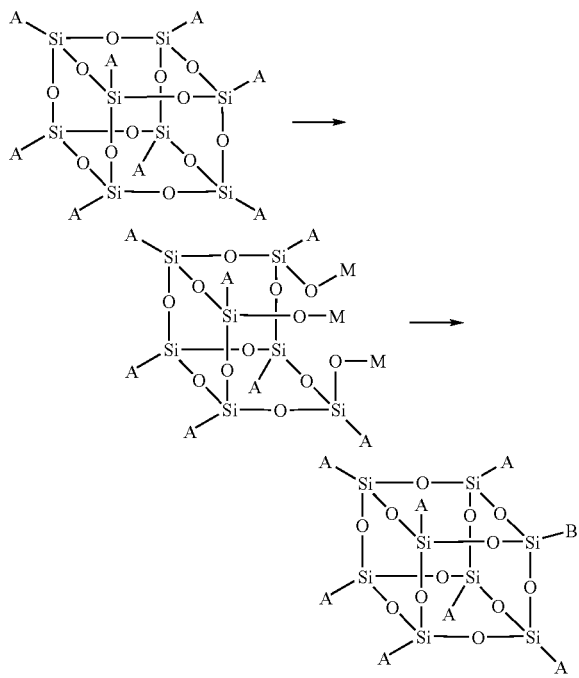

In the other reported method, once a SSQ polymer which is in an incompletely condensed state, but has a higher molecular weight as prepared by a prior art technique is taken out, it is converted into a cage structure using a large amount of base catalyst (see JP-A 2003-510337). It is unknown to apply this method to those monomers having less condensable bulky side chains which cannot be once taken out as a polymer.

On the other hand, it is known in the art that SSQ materials are prepared by carrying out base catalyzed condensation reaction at a high temperature above 100° C. for a prolonged time. The inventors discovered in JP-A 2004-354417 that polymeric compounds having a relatively high degree of condensation are obtained by carrying out the condensation reaction in two stages, that is, a first stage of hydrolysis to form a partial hydrolyzate of silicon, followed by concentration and isolation for removing the alcohol by-product and extra water, and a second stage wherein the base catalyst is used in a large amount of at least 10% based on the monomer units.

DISCLOSURE OF THE INVENTION

An object of the present invention is to provide a method for preparing a silsesquioxane compound mixture having a higher proportion of SSQ compounds having a degree of condensation of substantially 100%, which mixture has higher stability than prior art SSQ compounds having silanol groups as functional group, and which method is applicable to starting substances having bulky side chains and also applicable even when a plurality of different substituent groups are introduced in one stage.

Another object is to provide a silsesquioxane compound mixture having a higher proportion of SSQ compounds having a degree of condensation of substantially 100%, which can be used as a positive resist composition, especially a chemically amplified positive resist composition, as well as a positive resist composition comprising the SSQ compound mixture and a patterning process using the same.

As discussed in the preamble, patternable materials using POSS compounds are known from JP-A 2004-212983. The method disclosed therein, i.e., the method of incorporating functional groups into POSS compounds has the problem that in an attempt to incorporate sterically bulky substituent groups as the functional groups, it is impossible to incorporate at every position. Although it is suggested to derive POSS compounds from SSQ compounds having functional groups, how to implement is not disclosed at all. This technique relates to a patternable composition for forming a low dielectric constant layer. In an attempt to formulate the same as a resist composition having higher resolution, Tg must be elevated above a certain level because a film forming material having low Tg allows for an increased length of acid diffusion during pattern formation. In addition, a higher proportion of bulky substituent groups among substituent groups is desirable, but no study has been made from the aspect of obtaining POSS compounds. Subsequent to JP-A 2004-212983, the present inventors found that when a mixture of SSQ compounds having improved Tg is analyzed by gel permeation chromatography (GPC), more apparent peaks believed attributable to the octet appear than from mixtures obtained by other methods, and this causes to elevate Tg. However, even if the conditions of the disclosed method are adjusted, the resultant effect is such that peaks of octet become more characteristic on GPC chart than the prior art, and thus restrictive as viewed from the standpoint of increasing the proportion of octet.

Aiming to produce a SSQ compound mixture having a higher proportion of SSQ compounds having a degree of condensation of substantially 100%, the inventors have discovered that when condensation of trialkoxysilanes having bulky substituent groups is performed in two stages, and the second stage of reaction is performed by a specific method, the proportion of a component having a degree of condensation of substantially 100% in the product or SSQ polymer mixture is prominently increased. The proportion of the specific component formed varies with conditions. The proportion of the specific component formed can be increased to 50% or higher by optimizing the initial loading of water, the type of base catalyst, and removal of water during the reaction. There is a tendency that the amount of the 100% condensed component increases as condensation continues while adding water. The product has a thermodynamically stable structure.

Application of the above method makes it possible to introduce functional groups while designing such functions as functions of switching adhesion to substrates or the like and dissolution in alkaline water and while retaining high Tg, which has never been arrived at by prior art known synthesis methods of POSS compounds. The resulting SSQ condensate is useful as one component in a resist composition.

The present invention provides a silsesquioxane compound mixture, a method of preparing the same, and a resist composition and a patterning process using the same.

[1] A method for preparing a mixture of silsesquioxane compounds having a high proportion of silsesquioxane compounds bearing bulky substituent groups on side chain and having a degree of condensation of substantially 100%, said method comprising:

a first stage wherein a silane feed is hydrolyzed in the presence of an acid or base catalyst, said silane feed comprising a trifunctional silane bearing a bulky substituent group on side chain represented by the general formula (1):

wherein Y is an organic group of 3 to 20 carbon atoms, optionally having a functional group, containing an aliphatic branched, cyclic or polycyclic structure in which the atom at the silicon-bonding site is a carbon having at least two bonds with atoms other than hydrogen and halogen atoms in addition to said silicon, or an organic group of 6 to 18 carbon atoms, optionally having a functional group, containing an aromatic structure having a substituent group other than hydrogen and halogen atoms at a site neighboring the silicon-bonding site; $X^1$, $X^2$ and $X^3$ are each independently a hydrogen atom, halogen atom, straight, branched or cyclic alkoxy group of 1 to 6 carbon atoms, or aryloxy group of 6 to 10 carbon atoms, and a second stage wherein dehydrating condensation reaction is carried out in the presence of at least 0.5 mol % based on the silane feed of a strong base catalyst while removing the water resulting from condensation out of the reaction system.

[2] The method of [1] wherein an organic solvent is used in the second stage of dehydrating condensation in the presence of a strong base catalyst.

[3] A method for preparing a mixture of silsesquioxane compounds having a high proportion of silsesquioxane compounds bearing bulky substituent groups on side chain and having a degree of condensation of substantially 100%, said method comprising:

a first stage wherein a silane feed is hydrolyzed in the presence of an acid or base catalyst, said silane feed comprising a trifunctional silane bearing a bulky substituent group on side chain represented by the general formula (1):

wherein Y, $X^1$, $X^2$ and $X^3$ are as defined above, and a second stage wherein dehydrating condensation reaction is carried out in the presence of at least 0.5 mol % based on the silane feed of a strong base catalyst using an organic solvent in an amount of at least two times the weight of hydrolyzates resulting from hydrolysis while allowing the water resulting from condensation to transfer to the organic solvent.

[4] The method of [2] or [3] wherein the organic solvent used in the second stage of dehydrating condensation in the presence of a strong base catalyst is one which is separable from water.

[5] The method of any one of [1] to [4], further comprising the step of removing by fractionation a low condensed component from the reaction mixture obtained in the second stage of dehydrating condensation.

[6] The method of [5] wherein the fractionation is by re-precipitation, column partition or GPC partition.

[7] A silsesquioxane compound mixture comprising silsesquioxane compounds having a degree of condensation of substantially 100%, the mixture being prepared by performing:

a first stage wherein a silane feed is hydrolyzed in the presence of an acid or base catalyst, said silane feed comprising a trifunctional silane represented by the general formula (1):

wherein Y, $X^1$, $X^2$ and $X^3$ are as defined above, and a second stage wherein dehydrating condensation reaction is carried out in the presence of at least 0.5 mol % based on the silane feed of a strong base catalyst while removing water out of the reaction system.

[8] The silsesquioxane compound mixture of [7] wherein an organic solvent is used in the second stage of dehydrating condensation in the presence of a strong base catalyst.

[9] A silsesquioxane compound mixture comprising silsesquioxane compounds having a degree of condensation of substantially 100%, the mixture being prepared by performing:

a first stage wherein a silane feed is hydrolyzed in the presence of an acid or base catalyst, said silane feed comprising a trifunctional silane represented by the general formula (1):

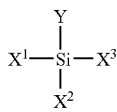

wherein Y, X¹, X² and X³ are as defined above, and
a second stage wherein dehydrating condensation reaction is carried out in the presence of at least 0.5 mol % based on the silane feed of a strong base catalyst using an organic solvent in an amount of at least two times the weight of hydrolyzates resulting from hydrolysis while allowing the water resulting from condensation to transfer to the organic solvent.

[10] The silsesquioxane compound mixture of [8] or [9] wherein the organic solvent used in the second stage of dehydrating condensation in the presence of a strong base catalyst is one which is separable from water.

[11] The silsesquioxane compound mixture of any one of [7] to [10], which is obtained by further performing the step of removing by fractionation a low condensed component from the reaction mixture obtained in the second stage of dehydrating condensation.

[12] The silsesquioxane compound mixture of any one of [7] to [11], wherein the silane feed comprises as the trifunctional silane at least one member selected from (A) monomer units having the general formula (2) and (B) monomer units having the general formula (3):

$$R^1\!-\!SiX^1_3 \quad (2)$$

$$R^2\!-\!SiX^2_3 \quad (3)$$

wherein R¹ is an organic group containing an aliphatic branched, cyclic or polycyclic structure of 3 to 20 carbon atoms, optionally containing a halogen (inclusive of fluorine), oxygen or sulfur atom, in which the atom at the silicon-bonding site is a carbon having at least two bonds with atoms other than hydrogen and halogen atoms in addition to said silicon, or an organic group of 6 to 18 carbon atoms, optionally having a functional group, containing an aromatic structure having a substituent group other than hydrogen and halogen atoms at a site neighboring the silicon-bonding site, the organic groups being capable of imparting adhesive nature to the molecule, R² is an organic group containing an aliphatic branched, cyclic or polycyclic structure of 3 to 20 carbon atoms in which the atom at the silicon-bonding site is a carbon having at least two bonds with atoms other than hydrogen and halogen atoms in addition to said silicon, said organic group having as a functional group a group which when deblocked, can impart alkali solubility to a molecule protected with an acid labile protective group, and optionally further containing a halogen, oxygen or sulfur atom, or an organic group of 6 to 18 carbon atoms, optionally having a functional group, containing an aromatic structure having a substituent group other than hydrogen and halogen atoms at a site neighboring the silicon-bonding site, X¹ and X² are each independently hydrogen, halogen or straight, branched or cyclic alkoxy group of 1 to 6 carbon atoms.

[13] The silsesquioxane compound mixture of [12] wherein the functional group structure capable of imparting adhesive nature to the molecule in the monomer units (A) is selected from a structure having a hydroxyl group in which at least three fluorine atoms in total are bonded to one or more carbon atoms bonded to the carbon atom having the hydroxyl group bonded, a carboxylic acid structure, a phenolic hydroxyl structure, and a lactone ring structure.

[14] The silsesquioxane compound mixture of [12] or [13] wherein the silane feed comprises as the trifunctional silane at least one member selected from the monomer units (A) having the general formula (2) and at least one member selected from the monomer units (B) having the general formula (3).

[15] A silsesquioxane compound mixture comprising at least 40 mol % based on silicon of silsesquioxane octet having a degree of condensation of substantially 100%, in which side chains comprise at least 75 mol % of side chains selected from:

organic groups containing an aliphatic branched, cyclic or polycyclic structure of 3 to 20 carbon atoms, optionally containing a halogen (inclusive of fluorine), oxygen or sulfur atom, in which the atom at the silicon-bonding site is a carbon having at least two bonds with atoms other than hydrogen and halogen atoms in addition to said silicon, or an aromatic structure of 6 to 18 carbon atoms, optionally having a functional group, having a substituent group other than hydrogen and halogen atoms at a site neighboring the silicon-bonding site, said organic groups being capable of imparting adhesive nature to the molecule, and organic groups containing an aliphatic branched, cyclic or polycyclic structure of 3 to 20 carbon atoms, optionally containing a halogen (inclusive of fluorine), oxygen or sulfur atom, in which the atom at the silicon-bonding site is a carbon having at least two bonds with atoms other than hydrogen and halogen atoms in addition to said silicon, or an aromatic structure of 6 to 18 carbon atoms, optionally having a functional group, having a substituent group other than hydrogen and halogen atoms at a site neighboring the silicon-bonding site, said organic groups having as a functional group a group which when deblocked, can impart alkali solubility to a molecule protected with an acid labile protective group.

[16] The silsesquioxane compound mixture of [15] wherein the functional group structure capable of imparting adhesive nature to the molecule is selected from a structure having a hydroxyl group in which at least three fluorine atoms in total are bonded to one or more carbon atoms bonded to the carbon atom having the hydroxyl group bonded, a carboxylic acid structure, a phenolic hydroxyl structure, and a lactone ring structure.

[17] The silsesquioxane compound mixture of [15] or [16] wherein the silsesquioxane octet of cage structure having a degree of condensation of substantially 100% is present in an amount of at least 50 mol % based on silicon.

[18] The silsesquioxane compound mixture of any one of [15] to [17] wherein all said side chains are selected from:

organic groups containing an aliphatic branched, cyclic or polycyclic structure of 3 to 20 carbon atoms, optionally containing a halogen (inclusive of fluorine), oxygen or sulfur atom, in which the atom at the silicon-bonding site is a carbon having at least two bonds with atoms other than hydrogen and halogen atoms in addition to said silicon, or an aromatic structure of 6 to 18 carbon atoms, optionally having a functional group, having a substituent group other than hydrogen and halogen atoms at a site neighboring the silicon-bonding site, said organic groups being capable of imparting adhesive nature to the molecule, and organic groups containing an aliphatic branched, cyclic or polycyclic structure of 3 to 20 carbon atoms, optionally containing a halogen (inclusive of fluorine), oxygen or sulfur atom, in which the atom at the silicon-bonding site is a carbon having at least two bonds with atoms other than hydrogen and halogen atoms in addition to said silicon, or an aromatic structure of 6 to 18 carbon atoms, optionally having a functional group, having a substituent group other than hydrogen and halogen atoms at a site neighboring the silicon-bonding site.

[19] A positive resist composition comprising the silsesquioxane compound mixture of any one of [7] to [18].

[20] The positive resist composition of [19], which is a chemically amplified positive resist composition further comprising an organic solvent and an acid generator.

[21] The positive resist composition of [19] or [20], further comprising a dissolution inhibitor.

[22] The positive resist composition of any one of [19] to [21], further comprising a basic compound and/or a surfactant.

[23] A patterning process comprising the steps of (1) applying the positive resist composition of any one of [19] to [22] onto a substrate; (2) heat treating the applied resist, then exposing the heat-treated resist through a photomask to high-energy radiation having a wavelength of at most 300 nm or an electron beam; and (3) optionally heat treating the exposed resist, then developing the resist with a liquid developer.

[24] The patterning process of [23], further comprising the step of processing the substrate by plasma etching after the developing step.

BENEFITS OF THE INVENTION

According to the invention, a SSQ compound mixture having a higher proportion of SSQ compounds bearing bulky substituent groups and having a degree of condensation of substantially 100% is obtainable in a simple and consistent fashion. A proper choice of functional groups permits the SSQ compound mixture obtained by the relevant reaction to become a material having adequate functional groups for positive resist compositions, overcoming the problem of prior art silicone resin based resist compositions that shelf stability declines due to residual silanol. Easy incorporation of sterically bulky substituent groups solves the low Tg and other problems of prior art silicone based resist compositions. This leads to improvements in the threshold resolution and other characteristics of resist compositions.

DESCRIPTION OF THE PREFERRED EMBODIMENTS

Figure 1:
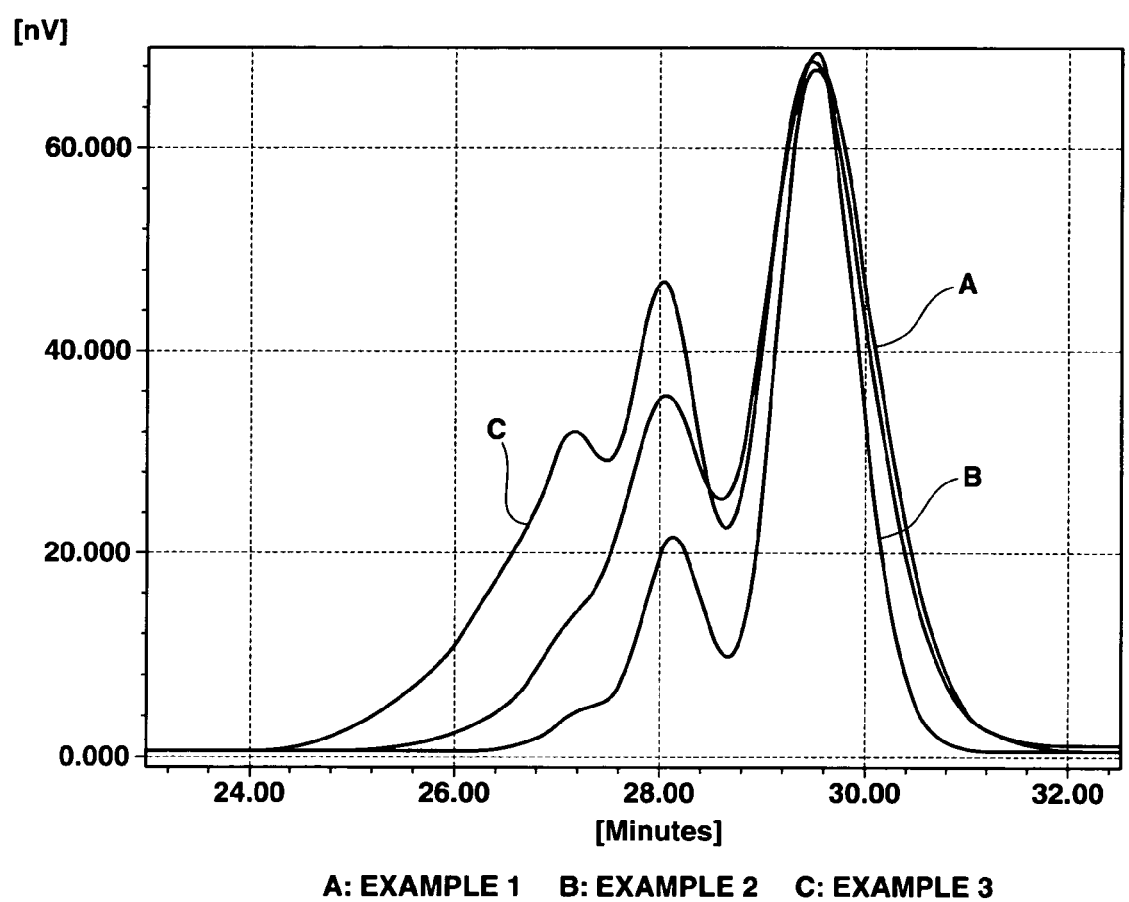
FIG. 1 illustrates GPC charts of the reaction mixtures of Examples 1, 2 and 3.

It is noted that the terms "a" and "an" herein do not denote a limitation of quantity, but rather denote the presence of at least one of the referenced item. Several abbreviations are used, SSQ stands for silsesquioxane and POSS stands for polyhedral oligomeric silsesquioxane.

Method

The first embodiment of the invention is described which pertains to a method for preparing a mixture of silsesquioxane compounds having a high proportion of silsesquioxane compounds bearing bulky substituent groups and having a degree of condensation of substantially 100%.

The method for preparing silsesquioxane compounds starts with a silane feed comprising a trifunctional silane bearing a bulky substituent group on side chain represented by the general formula (1):

wherein Y is an organic group of 3 to 20 carbon atoms, optionally having a functional group, containing an aliphatic branched, cyclic or polycyclic structure in which the atom at the silicon-bonding site is a carbon having at least two bonds with atoms other than hydrogen and halogen atoms in addition to said silicon, or an organic group of 6 to 18 carbon atoms, optionally having a functional group, containing an aromatic structure having a substituent group other than hydrogen and halogen atoms at a site neighboring the silicon-bonding site; $X^1$, $X^2$ and $X^3$ are each independently a hydrogen atom, a halogen atom, a straight, branched or cyclic alkoxy group of 1 to 6 carbon atoms, or an aryloxy group of 6 to 10 carbon atoms. It is noted that while similar definition is employed throughout the specification, the number of carbon atoms refers to that of the skeleton and does not include the carbon atoms in functional groups and other substituent groups.

If the majority of starting material is a hydrolyzable silane (serving as substrate) having a less sterically bulky side chain, that is, a side chain where the silicon-bonding carbon has less than or equal to one bond with atoms other than hydrogen and halogen, the inventive method has an increased tendency that higher oligomers form preferentially. The method improves the degree of condensation of the overall system, but its effect is extremely restricted in increasing the proportion of SSQ compounds having a degree of condensation of substantially 100%. On the other hand, if the silane feed is a silane in which the silicon-bonding carbon on side chain is a carbon having at least three bonds with atoms other than hydrogen and halogen, and silicon, and especially tertiary carbon or carbon to constitute an aliphatic cyclic or condensed ring skeleton, or the silicon-bonding carbon is an atom to constitute an aromatic ring and has a substituent group other than hydrogen and halogen substituted at its neighboring site, it can be utilized very advantageously. If the proportion of trifunctional silane is at least 75 mol %, preferably at least 95 mol %, more preferably 100 mol %, the inventive method is successful in increasing the proportion of SSQ compounds having a degree of condensation of 100%, especially cage shaped octet, in the SSQ compound mixture produced.

As used herein, the "degree of condensation" refers to T3/(T1+T2+T3) as determined by $^{29}$Si-NMR spectroscopy wherein T1: R—Si(OR)$_2$O—Si,
T2: R—Si(OR)(—O—Si)$_2$,
T3: R—Si(—O—Si)$_3$.

Preferred examples of Y which will eventually yield a material that can be employed where certain transparency to light of less than or equal to 200 nm is required, or certain resistance to dry etching is required, for example, include side chains of the structure in which silicon is directly bonded to a norbornane skeleton, tricyclodecane skeleton, tetracyclododecene skeleton, bicyclononane skeleton, decalin skeleton, and hetero condensed ring skeleton in which one or more carbon is substituted by one or more oxygen. Of these, those having a norbornane skeleton may have a relatively wider variety of functional groups. Examples of the side chain which is effective in increasing the proportion of SSQ compounds having a degree of condensation of 100%, include substituent groups in which the silicon-bonding carbon is tertiary carbon, which are customarily used as the bulky substituent group. Moreover, the effect of bulky substituent group is obtainable even from aromatic substituent groups if a substituent group which is not a small substituent group like hydrogen or fluorine is present at a site neighboring the silicon-bonding site. This aromatic substituent group is disadvantageous from the standpoint of transparency to light of less than or equal to 200 nm, but fully resistant to dry etching. Exemplary skeletons for the aromatic substituent group include benzene rings, naphthalene rings, anthracene rings, and partially hydrogenated forms thereof.

While there are many examples of the preferred side chain, the following groups are exemplary of the norbornane skeleton-bearing side chain.

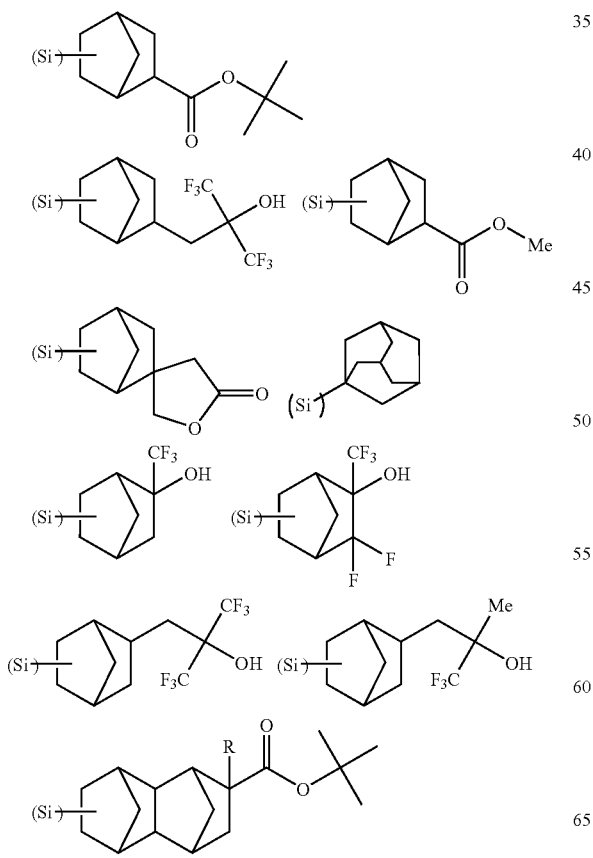

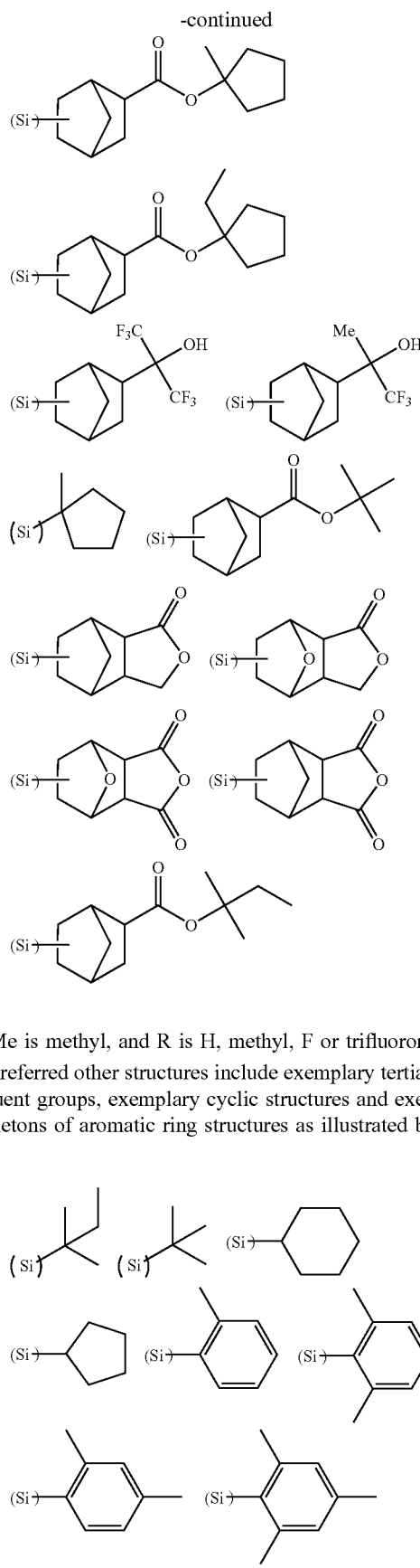

Me is methyl, and R is H, methyl, F or trifluoromethyl.

Preferred other structures include exemplary tertiary substituent groups, exemplary cyclic structures and exemplary skeletons of aromatic ring structures as illustrated below.

-continued

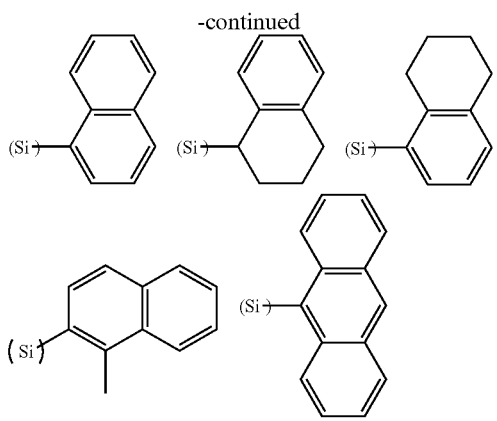

For a better understanding, a structure meaning that the benzene or naphthalene ring structure has a substituent group attached at a neighboring site is illustrated in the above formulae by depicting methyl as a typical substituent group. However, the substituent group is not limited to methyl. A significant bulky effect is achieved particularly when the substituent group is isopropyl or tert-butyl. Also, where the silicon atom is bonded to the naphthalene ring at α-position, the ring to which the silicon atom is not bonded becomes a neighboring substituent group, which corresponds to the bulky substituent group as used herein. This is also true for the anthracene ring.

According to the invention, the above-described silane feed is subjected to a first stage of hydrolysis in the presence of an acid or base catalyst, after which a second stage of dehydrating condensation is carried out in the presence of at least 0.5 mol % based on the silane feed of a strong base catalyst and under specific conditions. This yields a mixture of SSQ compounds having a high proportion of SSQ compounds bearing bulky substituent groups on side chain and having a degree of condensation of substantially 100%.

Problems arise if the condensation reaction is carried out in one stage. For example, if the hydrolyzable silane is a halosilane, a hydrogen halide forms to deactivate the catalyst. If the base is used in excess, preferential formation of a silicate form impedes formation of SSQ compounds (e.g., octets) having a degree of condensation of 100%. If the hydrolyzable silane is an alkoxysilane, hydrolysis forms a large amount of by-product alcohol, which retards the progress of condensation reaction and is detrimental to formation of components having a degree of condensation of 100%. It is thus recommended that hydrolysis reaction in the presence of an acid or alkali catalyst be first carried out and in a second stage, dehydrating condensation of the hydrolyzate in the presence of a strong base catalyst be carried out. In this process, once the hydrolyzate resulting from the first stage of hydrolysis is isolated in a substantially anhydrous state, the amount of water which is produced during condensation reaction and thus introduced into the second stage condensation reaction system is outstandingly reduced whereby the degree of condensation of the overall system is improved. Then, basically, inserting the step of isolating the hydrolyzate between the first and second stages is more effective. In some cases, the isolation operation is omitted, and instead, at an initial phase of the second stage, condensation may be carried out while distilling off the alcohol and excess water. On the other hand, the presence of a very small amount of water is requisite for equilibration reaction due to cleavage/recombination of siloxane bonds by the alkali catalyst. Thus the amount of 100% condensate produced largely depends on how to remove water. Specifically, SSQ compounds such as octet having thermodynamically most stable structure are sequentially formed while repeating cleavage and recombination of existing Si—O—Si linkages so that unreacted Si—OH may extinguish in the presence of a smaller amount of water than the moles of the base catalyst admitted.

The feature of the synthesis method of the invention, that is, what is needed to increase the proportion of 100% condensate in the SSQ condensates is, in the first place, to carry out condensation reaction while concurrently removing water out of the reaction system. The simplest water removing technique is by azeotropic distillation of water and organic solvent. In a small-scale plant, a large volume of organic solvent is added in advance, and the solvent is withdrawn together with water during the progress of reaction. An alternative procedure involves azeotroping off the organic solvent together with water, separating the water therefrom, and feeding the solvent back to the reaction system. An appropriate procedure may be selected from those procedures well known for ester synthesis through dehydrating condensation. The removal of water accelerates siloxane formation. However, if water is completely eliminated from within the system, water can no longer participate in recombination, impeding formation of 100% condensate. Then, in this case, a small amount of water may be added again, after which condensation reaction may be continued while performing water removal.

It is noted that the formation of SSQ compounds having a degree of condensation of 100% can be demonstrated by separating the reaction mixture after condensation into units by GPC, measuring by Si-NMR, and comparing T1/T2/T3 ratios. Specifically, the mixture is judged to be 100% condensate when no peaks assigned to T1 and T2 are observed and only a T3 signal is observed in the measurement of the smallest unit by Si-NMR. T1, T2 and T3 denote the following units:

T1: formation of one siloxane bond (the remaining two are silanol groups or residual hydrolyzable groups), T2: formation of two siloxane bonds (the remaining one is a silanol group or residual hydrolyzable group), and T3: formation of three siloxane bonds (completely condensed units).

The reaction procedure is described in more detail.

In the invention, the first stage of hydrolysis may be carried out in a conventional fashion. Preferably a catalyst is used in an amount of 0.01 to 30 mol % based on the amount of the silane feed, and the amount of water is 150 to 5,000 mol % based on the amount of the silane feed. Useful catalysts include acid catalysts such as acetic acid, hydrochloric acid, sulfuric acid, nitric acid, oxalic acid, citric acid, and p-toluenesulfonic acid, alkali catalysts such as ammonia, NaOH, KOH, methylamine, dimethylamine, trimethylamine, and tetramethylammonium salts, and transition metal catalysts such as acetylacetonatotitanium, Ti(acac). In this case, reaction may also be carried out while adding in addition to water, a water-miscible organic solvent such as alcohols (e.g., methanol, ethanol, isopropylalcohol), acetone or acetonitrile in an amount of 50 to 1,000% by weight based on the weight of the silane feed. Typically the reaction temperature is 0 to 60° C. and the reaction time is about 30 minutes to about 120 hours.

At the end of hydrolysis, preferably water is removed from the reaction mixture as mentioned above, and more preferably the hydrolyzate is taken out before use in the second stage of reaction. Understandably, depending on a choice of the solvent for hydrolysis reaction in the first stage, a transition from the first stage of hydrolysis to the second stage of condensation can occur via combinations of water removal, catalyst amount adjustment, and the like.

In the second stage of dehydrating condensation, a base catalyst having a lower vapor pressure than the solvent should preferably be chosen while ammonia, triethylamine or the like is less desirable. Preferred are strong alkalis such as alkali hydroxides and quaternary ammonium hydroxide and strongly basic amine catalysts such as 1,8-diazabicyclo [5.4.0]-7-undecene (DBU). A proper choice is made among those amines having higher basicity than 1,4-diazabicyclo [2.2.2]octane (DABCO). The amount of the base catalyst used, which varies with the strength of basicity thereof, is 0.5 to 100 mol %, preferably 5 to 50 mol %, more preferably 10 to 30 mol % based on the monomer units (the silane feed). From the relationship to the reactivity of residual silanol, the hydrolyzate should preferably have such a structure that all silanols can readily react, and therefore, the hydrolyzate should preferably have a relatively low molecular weight of the order of several hundred to thousand.

The feature of the condensation reaction of the invention is, after the first stage of hydrolysis using the above-described silane feed, to carry out a second stage of dehydrating condensation while concurrently removing the water resulting from condensation. In a situation where the water resulting from reaction can impede the progress of dehydrating condensation, it is a well-known measure to carry out condensation while removing the water as formed. In the synthesis of ordinary SSQ polymers, the measure is taken particularly when a higher polymer is desired. Nevertheless, if this measure is applied to condensation of trifunctional hydrolyzable silane compounds having sterically bulky side chains, quite unexpectedly, as the degree of condensation increases (or the number of silanols decreases), the proportion of cage shaped SSQ compounds having a degree of condensation of 100% increases rather than the reaction product mixture increases in average molecular weight.

In a relatively large-scale plant, to carry out dehydrating condensation while concurrently removing the water formed, a procedure of using an organic solvent which is separable from water, removing a water/solvent mixture by azeotropic distillation or the like, separating the mixture into water and the solvent, and feeding only the solvent back to the reaction system is efficient. The measure of selection of an organic solvent that enables such operation is that the organic solvent has an azeotropic temperature with water within the temperature range adequate for the reaction and has a solubility of up to 5% of water. Specifically, an organic solvent such as methyl isobutyl ketone, toluene or xylene is preferably used in an amount of 50 to 1,000% by weight, more preferably 50 to 500% by weight based on the hydrolyzate. When the amount of solvent is increased to or above 200% by weight based on the hydrolyzate, the proportion of cage shaped octet having a degree of condensation of 100% is advantageously increased.

In this case, the cage shaped octet having a degree of condensation of 100% can also be produced in high yields by using an organic solvent for condensation reaction in an amount of at least 200% by weight, or at least two times the weight of the hydrolyzate instead of the step of removing water out of the reaction system, and allowing the water resulting from condensation to transfer to the organic solvent for thereby minimizing the influence of water. It is preferred for ensuring the yield per batch of the target product and from the industrial economy that the upper limit of the solvent is up to 1,000% by weight (up to 10 times).

The reaction temperature is preferably at least 100° C., more preferably at least 115° C. The upper limit of reaction temperature is not particularly specified and when an organic solvent is added, it is the reflux temperature of the solvent. The reaction time is usually at least 8 hours.

The presence of a minor amount of water in the reaction system is essential for isomerization from a high molecular weight SSQ compound to a completely condensed low molecular weight SSQ compound. If the amount of water is extremely reduced, the rate of isomerization reaction is reduced, resulting in an ineffective production method. In this case, a small amount (about 1 to 3 mol % based on the hydrolyzate) of water may be externally added, allowing condensation to continue.

It is noted that in case many substituent groups on silicon atom are not bulky as in the prior art synthesis of SSQ compound having a degree of condensation of 100%, the degree of condensation is improved by carrying out the step of removing water out of the system during condensation reaction as specified under the reaction conditions of the invention, but the formation of cage shaped octet component having a degree of condensation of 100% does not become predominant, and a SSQ compound having a higher average molecular weight would form. Then, to synthesize a component having a degree of condensation of 100%, a method is employed wherein condensation reaction accompanied by equilibration reaction is carried out under conditions containing above a certain level of water for a long time, followed by neutralization and cooling, whereby a highly crystalline complete condensate precipitates as solids. Since the degree of condensation per se is not so high, the benefit is a capability to take out a component having a degree of condensation of 100% through crystallization. It is then difficult to have complex functional groups incorporated prior to the condensation.

In contrast, the present invention is very effective as a method for preparing a SSQ compound which has so bulky organic groups on silicon atoms that it cannot reach a sufficient degree of condensation under ordinary hydrolytic conditions, and for which an effective synthesis method has not been discovered. When a mixture of trifunctional hydrolyzable silanes which have a somewhat uniform degree of bulkiness around silicon, that is, in which preferably at least 75 mol %, more preferably at least 95 mol % of substituent groups, and most preferably all substituent groups are bulky, is subjected to hydrolysis and condensation, a SSQ compound mixture having a high proportion of 100% condensed SSQ compound can be produced even from those compounds which have so different types of substituent groups that crystallinity is not expectable.

As long as most preferred conditions are selected, the preparation method of the invention can produce the target cage-shaped octet having a degree of condensation of 100% in a high yield of at least 70% as determined by gel permeation chromatography-refractive index (GPC-RI) area ratio. However, since a SSQ compound having a bulky substituent group is less crystalline than a SSQ compound having a small substituent group, crystallization by cooling measures is unsuccessful in most cases. Therefore, when it is desired to further enhance the proportion of 100% condensate in the reaction mixture, a purifying step as by addition of a poor solvent or column passage is often necessary.

In this case, the step of removing by fractionation a low condensed fraction from the reaction mixture after the second stage of dehydrating condensation is preferably carried out. For the fractionation, re-precipitation, column partition, GPC partition or the like may be employed.

According to the invention, the above-described method can produce a mixture containing a significantly increased proportion of SSQ compound having bulky substituent groups on side chain and a degree of condensation of substantially 100%. Generally, one of oligomers of 6 to 12 monomer units having a thermodynamically most stable structure due to the size of side chain group (Y), as shown below, typically SSQ octet, can be obtained in a predominant excessive amount.

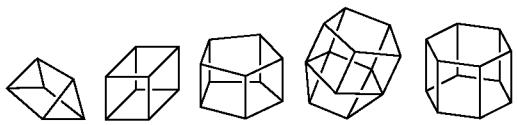

Herein, each apex denotes a silicon atom having one substituent group, and each side denotes a Si—O—Si linkage.

SSQ Compound Mixture

The second embodiment described below is a SSQ compound mixture containing a high proportion of SSQ compound having bulky substituent groups and a degree of condensation of substantially 100%, which was first produced by the method of the invention.

The SSQ compound mixture containing a high proportion of SSQ compound having a degree of condensation of substantially 100%, which is suitable as one component of a resist composition, is obtainable by using a hydrolyzable silane monomer feed comprising at least one member selected from (A) monomer units having the general formula (2) and (B) monomer units having the general formula (3), preferably at least one member selected from (A) and at least one member selected from (B), and carrying out hydrolysis and condensation in the same manner as in the aforementioned method.

$$R^1\text{—SiX}^1_3 \qquad (2)$$

$$R^2\text{—SiX}^2_3 \qquad (3)$$

Herein $R^1$ is an organic group containing an aliphatic branched, cyclic or polycyclic structure of 3 to 20 carbon atoms, optionally containing one or more halogen (inclusive of fluorine), oxygen or sulfur atom, in which the atom at the silicon-bonding site is a carbon having at least two bonds with atoms other than hydrogen and halogen atoms in addition to said silicon, or an organic group of 6 to 18 carbon atoms, optionally having a functional group, containing an aromatic structure having a substituent group other than hydrogen and halogen atoms at a site neighboring the silicon-bonding site, the organic groups being capable of imparting adhesive nature to the molecule, $R^2$ is an organic group containing an aliphatic branched, cyclic or polycyclic structure of 3 to 20 carbon atoms in which the atom at the silicon-bonding site is a carbon having at least two bonds with atoms other than hydrogen and halogen atoms in addition to said silicon, said organic group having as a functional group a group which when deblocked, can impart alkali solubility to a molecule protected with an acid labile protective group, and optionally further containing a halogen, oxygen or sulfur atom, or an organic group of 6 to 18 carbon atoms, optionally having a functional group, containing an aromatic structure having a substituent group other than hydrogen and halogen atoms at a site neighboring the silicon-bonding site, $X^1$ and $X^2$ are each independently hydrogen, halogen or a straight, branched or cyclic alkoxy group of 1 to 6 carbon atoms.

With regard to monomer units (A), examples of the adhesive nature-imparting functional groups represented by $R^1$ include functional groups having a hydroxyl group, carboxyl group, cyclic ether structure, ester structure, $\alpha,\beta$-diketone structure or the like. Of these, a structure having a hydroxyl group in which at least three fluorine atoms in total are bonded to one or more carbon atoms bonded to the carbon atom having the hydroxyl group bonded, a carboxylic acid structure, a phenolic hydroxyl structure, and a lactone ring structure are effective. Understandably, the amount of carboxylic acid structure used is limited to a certain level because of strong acidity; and the amount of phenolic hydroxyl structure used is limited because of opaqueness when exposure light of less than or equal to 200 nm is used. Then in the event exposure light of 193 nm is used, for example, the structure having a hydroxyl group in which at least three fluorine atoms in total are bonded to one or more carbon atoms bonded to the carbon atom having the hydroxyl group bonded and the lactone ring structure are more preferred functional groups.

Also, the structure having a hydroxyl group in which at least three fluorine atoms in total are bonded to one or more carbon atoms bonded to the carbon atom having the hydroxyl group bonded is a functional group which is very effective for preventing the resist from swelling during the development step in a patterning process, but tends to detract from resistance to dry etching. Using this structure in combination with the lactone ring structure compensates for this deficiency.

Illustrative examples of the substituent group bearing a structure having a hydroxyl group in which at least three fluorine atoms in total are bonded to one or more carbon atoms bonded to the carbon atom having the hydroxyl group bonded include substituent groups of the following formulae (A).

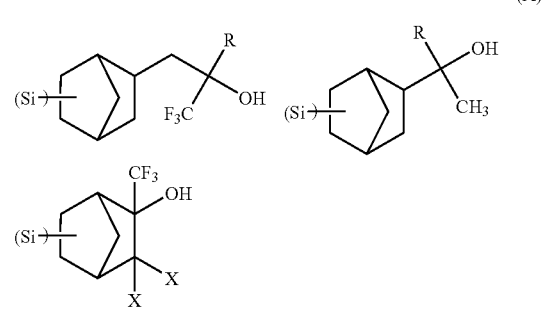

Herein R stands for H, $CH_3$, $CF_3$ or F, and X stands for H or F.

The lactone structure-bearing side chains include those in which a lactone structure is bonded to a cyclic skeleton as a pendant and polycyclic structures a portion of which is a lactone structure. The latter are especially preferred because they are effective for elevating the glass transition temperature. Illustrative examples of such structure are shown below.

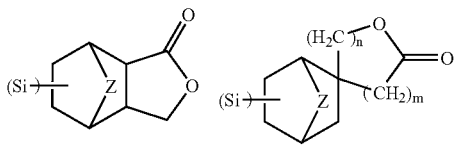

Herein Z is an oxygen atom, sulfur atom or methylene group, n is 0 or 1, and m is 0 or 1.

Other examples of the adhesive functional groups include those of the following structure.

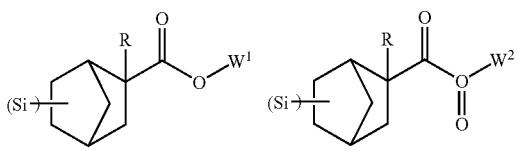

Herein R stands for H, F, $CH_3$ or $CF_3$, and $W^1$ and $W^2$ are each independently an alkyl group of 1 to 6 carbon atoms.

With regard to monomer units (B), the functional groups are substituent groups which impart a function of switching solubility in alkaline aqueous solution to the resin in ordinary resist compositions, that is, acid labile groups. They exert a similar function in the SSQ condensate of the invention. For the substituent group $R^2$ having such a function, a number of acid labile groups are known in the art. One of the latest publications is JP-A 2005-36146, and the functional groups illustrated therein are applicable to the present invention.

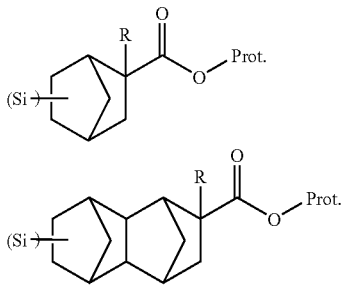

Herein R stands for H, $CH_3$ or F, and Prot. stands for an acid labile group as shown below.

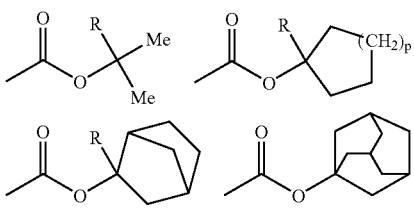

For convenience of illustration, the distal portion extending from the ester moiety is shown. R is $CH_3$, $C_2H_5$, $CF_3$ or F, Me is methyl, and p is 1 or 2.

Of these, the acid labile protective group containing a sterically bulky ring structure is most preferred for higher reactivity of acid decomposition.

Although the protected functional group in which the acidic group for acquiring solubility in alkaline water is carboxylic acid has been illustrated above, protected acidic groups are also acceptable having the structure having a hydroxyl group in which at least three fluorine atoms in total are bonded to one or more carbon atoms bonded to the carbon atom having the hydroxyl group bonded. For such groups, the groups shown by the above formulae (A) whose alcohol is protected with a t-BOC or acetal group are well known, and they may be used herein as well.

Since the proportion of functional groups necessary for solubility switching depends on the presence or absence of a polymeric or non-polymeric dissolution inhibitor and an alkali-soluble substance to be separately added and the type thereof if present, it is impossible to specify an appropriate range unequivocally. In general, a satisfactory solubility switching function is achievable when formulation is designed such that the functional groups necessary for solubility switching account for at least 10 mol %, more preferably at least 20 mol % of overall functional groups in the SSQ condensate of the invention and other additives. The upper limit is usually up to 90 mol %, especially up to 80 mol %.

To produce a SSQ condensate having a relatively high Tg, the side chain should be such that the carbon at the silicon-bonding site have a sterically bulky environment, and a linker group linking the silicon atom and the above-mentioned functional group should preferably be tertiary or have a substituted ring structure, especially substituted fused ring structure. Preferred examples of these skeletons include norbornane skeletons, tricyclodecane skeletons, tetracyclododecene skeletons, bicyclononane skeletons, decalin skeletons, and hetero fused ring skeletons in which one or more carbon in the foregoing skeletons is replaced by one or more oxygen. Synthesis of monomers to form these compounds is achieved by a combination of well-known functional group modifying reaction, Diels-Alder reaction and hydrosilylation reaction as shown below.

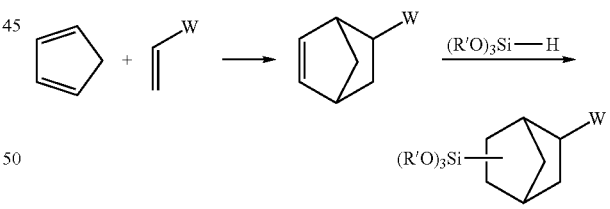

Herein W is a substituent group, and R' is $C_1$-$C_4$ alkyl.

The SSQ condensate mixture in the second embodiment of the invention, which is suitable for use in a positive resist composition, is advantageously produced by the method in the first embodiment.

Specifically, the SSQ compound mixture is produced by using a hydrolyzable silane monomer feed comprising at least one member selected from (A) monomer units having the general formula (2) and (B) monomer units having the general formula (3), preferably at least one member selected from (A) and at least one member selected from (B), and carrying out hydrolysis and condensation in accordance with the aforementioned method.

The monomer units (A) and (B) are preferably used in such amounts that the molar ratio of monomer units (A) to monomer units (B) is 5-100:0-90, and more preferably 10-100:0-80, provided that the total of monomer units is 100. Additional monomer units other than (A) and (B) may be incorporated for increasing a Si content or for improving adhesion, resolution or the like.

It is noted that when (B) is 0, that is, the SSQ condensate mixture is used as negative resist, or when the SSQ condensate mixture is used in a resist composition wherein the solubility switching function is allocated to another component, the side chain structure should contain at least five of structures having a hydroxyl group in which at least three fluorine atoms in total are bonded to one or more carbon atoms bonded to the carbon atom having the hydroxyl group bonded, carboxylic acid structures or phenolic hydroxyl structures, rather than consisting of lactone ring structures.

One of preferred combinations is a combination of a monomer having as side chain a structure having a hydroxyl group in which at least three fluorine atoms in total are bonded to one or more carbon atoms bonded to the carbon atom having the hydroxyl group bonded and a monomer having as side chain a lactone structure. When this combination is used as the monomer units (A), it is preferred that the monomer having as side chain a structure having a hydroxyl group in which at least three fluorine atoms in total are bonded to one or more carbon atoms bonded to the carbon atom having the hydroxyl group bonded be 20 to 40 mol %, the monomer having as side chain a lactone structure be 20 to 40 mol %, and a monomer having as side chain an acidic functional group structure protected with an acid labile protective group be 20 to 60 mol %.

The silane feed should preferably contain 50 to 100% by weight, more preferably 80 to 100% by weight of the silane of formula (2) and/or the silane of formula (3) combined. There may be included silanes other than the silanes of formulae (2) and (3), examples of which are given below.

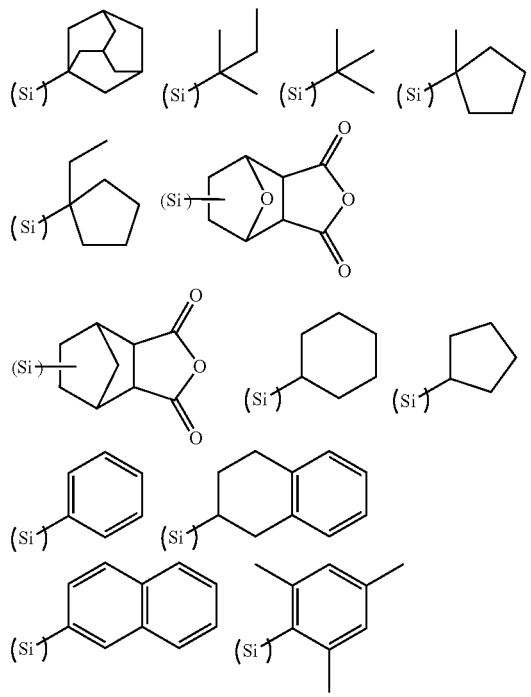

In the practice of the method of the first embodiment, if a mixture of silanes which have a somewhat uniform degree of bulkiness around silicon is used, hydrolysis and condensation of a mixture of silanes having substituent groups of different type yields a mixture of SSQ compounds having a unit ratio corresponding to the mix ratio of monomers, which mixture has a high proportion of 100% condensed SSQ compound. The above-described design for use as a component in resist composition is possible.

By the method of the first embodiment, the target 100% condensate can generally be produced in a yield of at least 50% as determined by GPC-RI area ratio, and even in a high yield of at least 70% if most preferred conditions are selected. However, since a SSQ compound having a bulky substituent group is less crystalline than a SSQ compound having a small substituent group, crystallization by cooling measures is unsuccessful in most cases. On the other hand, if the product by the inventive method has a degree of condensation of at least 90%, this ensures that 100% condensate is included in the product. The effect of 100% condensate is exerted when the product is formulated into a composition. The preferred ultimate degree of condensation is 95% or higher. It is noted that the degree of condensation can be readily determined by analyzing the crude product by Si-NMR spectroscopy. Namely, the formation of SSQ compound having a degree of condensation of 100% can be demonstrated by separating the reaction mixture after condensation into units by GPC, measuring by Si-NMR, and comparing T1/T2/T3 ratios. Units T1, T2 and T3 are:

T1: formation of one siloxane bond (the remaining two are silanol groups or residual hydrolyzable groups), T2: formation of two siloxane bonds (the remaining one is a silanol group or residual hydrolyzable group), and T3: formation of three siloxane bonds (completely condensed units).

In the above procedure, the identification of each peak on a GPC chart is preceded by isolation by GPC partition. In a general procedure, the proportion of 100% condensate in the SSQ compound mixture produced is determined by using RI as a detector, taking a GPC chart in which specific peaks of 100% condensate appear, and presuming the ratio of the area of the specific peaks to the overall area. For the presumption of the peak area ratio, the vertical partition technique (an area is determined by drawing vertical lines from the bottoms of valleys to the holding time axis) is employed. The assignment of a specific peak to 100% condensate was determined by isolating the peak by GPC partition, measuring by Si-NMR, and confirming the absence of signals assigned to T1 and T2.

It is noted that since the identification of a peak-constituting substance corresponding to the 100% condensate is not done in the general procedure, the peak-constituting substance is referred to as "SSQ having a degree of condensation of substantially 100%" throughout the specification.

In the event it is desired to obtain 100% condensate of higher purity, when a plurality of substituent groups are incorporated, crystallization is no expectable. However, fractionation using a poor solvent or the like is effective in removing low molecular weight substances. When it is desired to increase the purity above the level achieved by fractionation using a poor solvent or the like, fractionation by GPC or the like must be employed.

The third embodiment of the invention is a SSQ compound mixture comprising at least 40 mol % based on silicon of SSQ octet having a degree of condensation of substantially 100%, in which side chains comprise at least 75 mol % of side chains selected from:

organic groups containing an aliphatic branched, cyclic or polycyclic structure of 3 to 20 carbon atoms in which the atom at the silicon-bonding site is a carbon having at least two bonds with atoms other than hydrogen and halogen atoms in addition to said silicon, and which may contain a halogen (inclusive of fluorine), oxygen or sulfur atom, or an aromatic structure of 6 to 18 carbon atoms, optionally having a functional group, having a substituent group other than hydrogen and halogen atoms at a site neighboring the silicon-bonding site, said organic groups being capable of imparting adhesive nature to the molecule, and organic groups containing an aliphatic branched, cyclic or polycyclic structure of 3 to 20 carbon atoms, optionally containing a halogen (inclusive of fluorine), oxygen or sulfur atom, in which the atom at the silicon-bonding site is a carbon having at least two bonds with atoms other than hydrogen and halogen atoms in addition to said silicon, or an aromatic structure of 6 to 18 carbon atoms, optionally having a functional group, having a substituent group other than hydrogen and halogen atoms at a site neighboring the silicon-bonding site, said organic groups having as a functional group a group which when deblocked, can impart alkali solubility to a molecule protected with an acid labile protective group.

As pointed out above, the SSQ compound mixture having the above-described feature was first produced by the method of the first embodiment. Further, as also described above, in order that a mixture having a higher proportion of SSQ compound having a degree of condensation of substantially 100% be produced by the method of the first embodiment, more preferably all side chains are selected from organic groups containing an aliphatic branched, cyclic or polycyclic skeleton or organic groups containing an aromatic skeleton having a substituent group other than hydrogen and halogen atoms at a site neighboring the silicon-bonding site.

Resist compositions will be described later. Evaluating a positive thin-film resist composition for micropatterning using only the SSQ mixture as the base polymer, the inventors found that a composition containing more than 40% of an octet condensate having a degree of condensation of substantially 100% can improve the capability of resolving repetitive micropatterns, so called line-and-space patterns, as compared with a composition containing less than or equal to 30% of an octet condensate having a degree of condensation of substantially 100% like the SSQ mixture having a high degree of condensation (Si-NMR analysis of the mixture reveals a T3 peak area of 92% and a T2 peak area of 8%) obtained in Example of JP-A 2004-354417; and a more predominant effect is exerted when the composition contains more than 50% of the octet condensate. It is presumed by investigations from various standpoints that this effect is accounted for by not only Tg, but also the increased proportion of 100% SSQ compound.

Resist Composition

The SSQ condensate (or SSQ compound) mixture of the invention may be used as the base resin in a resist composition directly in condensate mixture form or after isolation, and particularly useful as the base resin in a positive resist composition. Then, the fourth embodiment of the invention is a positive resist composition comprising a SSQ compound mixture having a high proportion of SSQ condensate. As described above, none of the prior art succeeded in providing a material comprising at least 30% by weight of a SSQ compound having a degree of condensation of 100% and further having a high Tg due to incorporation of bulky substituent groups. The material of the invention is expected useful not only as a bilayer resist material, but also as an etching mask over a silicon oxide film when side chains having polycyclic structure are incorporated. Then the resulting resist composition is useful as a material for forming a more microscopic pattern via a thin film resist.

Base Resin

In general, the resin serving as the main component in chemically amplified positive resist compositions is required to have a functional group giving a function of switching from insolubility to solubility in alkaline water under the action of an acid catalyst (typically, an acidic functional group protected with an acid labile group), a polar group giving a function of imparting adhesion to substrate or the like or restraining swell upon solubility switching, or a functional group having resistance to plasma etching using halogen or the like, though not necessarily required for silicon-containing resist compositions. In some cases, all the functions are met by a single functional group. Alternatively, for a resin lacking any of the above functions or a resin having a weak function, a number of methods have been reported including a method of satisfying the functions as a whole by combining different resins, a method of satisfying the functions as a whole by adding a functional non-polymeric substance.

A SSQ condensate mixture such as one having a degree of condensation of substantially 100%, which is suitable as the resist composition of the invention, has at least one of the above-mentioned functional groups. Using such a mixture having all the functions or a mixture obtained by mixing such mixtures so as to have all the functions, alone in combination with a photoacid generator, a resist composition can generally be formulated.

In the event a SSQ condensate has a side chain possessing a function of dissolving in alkaline developer, but lacking a function of changing alkali solubility under the action of an acid catalyst, that is, a solubility switching function, or possessing only a weak solubility switching function, a polymeric compound (any of resins used in conventional resist compositions may be employed as a general rule) or non-polymeric compound having a solubility switching function, commonly known as "dissolution inhibitor," may be added in formulating a resist composition.

Also when a pattern is formed from a resist film having a relatively large thickness, a composition having low molecular weight compounds combined would give a pattern with less rectangularity, that is, with rounded top. In this case, a pattern profile may be improved by adding a polymer having a weight average molecular weight of at least 4,000. The resin used for this purpose is selected from resins which are soluble in alkaline developer or resins having a solubility switching function as used in conventional resist compositions.

When the SSQ condensate mixture is mixed with another polymer to formulate a resist composition, the polymer is selected from resins having a functional group for adding a certain function, or resins which themselves can be used as the resist resin. Applicable are those resins having a basic skeleton which is a polyhydroxystyrene skeleton, poly (meth)acrylic acid skeleton, ROMP skeleton, polynorbornene skeleton, COMA skeleton or skeleton comprising a combination of such skeletons. However, a resin having a high silicon content is preferred when resistance to oxygen plasma etching is desired. In this case, a choice may be made among those resins having a silicon-containing side chain on any of the foregoing skeletons, polysilsesquioxanes, polysiloxanes, and polymers having a combination of such skeletons. A number of exemplary such polymers are known in the art, for example, from JP-A 2004-354417 and Japanese Patent Application No. 2005-38701 of the present inventors. However, if the functional side chain the SSQ condensate of the invention possesses and the functional side chain the foregoing polymers possess are different in nature, especially largely different in overall polarity, an intimate mixing within the resist film cannot be achieved in some cases. To achieve satisfactory mixing between them, an effective design for enhancing compatibility is made such that both components possess polar groups, typically carboxyl groups, lactone skeletons, phenolic hydroxyl groups, or aliphatic hydroxyl groups having fluorine substituted at a neighboring site.

Where the target pattern rule is equal to or less than 100 nm and the resist film is relatively thin, the necessity that the material of which the resist composition is made be a polymer is alleviated. Particularly when a pattern with a feature size equal to or less than 70 nm is formed, a higher resolution may be achieved by reducing the addition ratio of the polymer or even omitting the addition of polymer. In these resist compositions, a polymer having a relatively low, uniform molecular weight is believed advantageous for micropatterning because it exhibits a definite and sharp dissolution behavior. The 100% condensed SSQ compound mixture of the invention, despite some molecular weight variants due to different type of substituent group, is of great interest as a typical model because molecules having a similar number of units become the main component of the resist composition.

In the resist composition comprising as the base resin the 100% condensed SSQ compound mixture of the invention, better results are obtained when the side chain having a solubility switching function relative to alkaline water (typically the side chain having an acidic functional group protected with an acid labile group) is at least 10 mol % of the entire side chains, and a higher contrast is expected when the same is at least 20 mol %. The upper limit is up to 90 mol %. A functional group imparting adhesion is also essential and preferably at least 5 mol %, especially 20 to 80 mol %.

As described above, the use of a base polymer of molecules with a somewhat uniform size is believed advantageous for miniaturization. In fact, a mixture containing more than 40 mol % (on silicon basis) of octet as produced by the inventive method was found to have improved threshold resolution in forming a line-and-space pattern, with a mixture containing more than 50 mol % of octet being more effective.

Photoacid Generator

In the resist composition of the invention, a photoacid generator is essential as well as the aforementioned material. The acid generator in resist compositions is a compound which, after formation of a resist film, generates an acid upon receipt of the energy of irradiating light during pattern exposure. In the resist film formed from the inventive resist composition, the acid thus generated functions as a catalyst and acts on the acid labile protective groups on the protected acidic substituent groups in the SSQ condensate and/or dissolution inhibitor or additive resin, causing scission of the protective groups and rendering the acidic substituent groups free. As a result, a region of the resist film where the deblocking reaction occurs is turned to be soluble in aqueous alkaline developer. With respect to the acid generator, a number of techniques relating to non-silicone resist compositions have already been disclosed, for example, in JP-A 2004-149754. All these techniques are applicable to the present invention. Among others, preferred photoacid generators include sulfonium salts, iodonium salts, sulfonyldiazomethanes, N-sulfonyloxyimides, and N-sulfonyloxyoximes. These photoacid generators are illustrated below while they may be used alone or in admixture of two or more in a common system or in different systems. Inter alia, onium salts, especially sulfonium salts are useful acid generators. These acid generators may also advantageously be used as a co-acid generator along with another acid generator.

Sulfonium salts are salts of sulfonium cations with sulfonates. Exemplary sulfonium cations include substituted or unsubstituted triphenylsolfoniums such as triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium; substituted or unsubstituted allylsulfoniums such as 2-naphthyldiphenylsulfonium and dimethyl-2-naphthylsulfonium; and sulfoniums having a non-aromatic substituent group such as 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, and 2-oxo-2-phenylethylthiacyclopentanium.

Exemplary sulfonates include sulfonates in which the carbon neighboring a sulfonyl group is fluorine substituted, such as trifluoromethanesulfonate, nonafluorobutanesulfonate, heptadecafluorooctanesulfonate, 2,2,2-trifluoroethanesulfonate, perfluoro-4-ethylcyclohexanesulfonate and pentafluorobenzenesulfonate; aromatic sulfonates such as 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, and naphthalenesulfonate; and alkylsulfonates such as camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Included are combinations of aryliodonium cations including diphenyliodinium, bis(4-tert-butylphenyl)iodonium, 4-tert-butoxyphenylphenyliodonium, and 4-methoxyphenylphenyliodonium with sulfonates as exemplified above.

Suitable sulfonyldiazomethane compounds include alkyl-substituted sulfonyldiazomethanes such as bis(1,1-dimethylethylsulfonyl)diazomethane, bis(cyclohexylsulfonyl)diazomethane; fluoroalkyl-substituted sulfonyldiazomethanes such as bis(perfluoroisopropylsulfonyl)diazomethane; and aryl-substituted sulfonyldiazomethanes such as bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, tert-butoxycarbonyl-4-methylphenylsulfonyldiazomethane.

N-sulfonyloxyimide photoacid generators include combinations of imide skeletons such as succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide with sulfonates as exemplified above, wherein dehydrating condensation of sulfonates to imide skeletons forms sulfonic acid imides.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Oxime sulfonate photoacid generators include glyoxime derivatives as described in Japanese Patent No. 2,906,999 and JP-A 9-301948, such as bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime, those in which the sulfonate moiety is replaced by a skeleton exemplified as the sulfonate of the onium salt, and those in which the substituent group on the glyoxime skeleton is another alkyl group.

Also included are the oxime sulfonates described in U.S. Pat. No. 6,004,724, for example, (5-(4-toluenesulfonyl)oxyimino-5H-thiophen-2-ylidene)phenylacetonitrile,
(5-(10-camphorsulfonyl)oxyimino-5H-thiophen-2-ylidene)phenylacetonitrile,
(5-n-octanesulfonyloxyimino-5H-thiophen-2-ylidene)phenylacetonitrile,
(5-(4-toluenesulfonyl)oxyimino-5H-thiophen-2-ylidene)(2-methylphenyl)acetonitrile,
(5-(10-camphorsulfonyl)oxyimino-5H-thiophen-2-ylidene)(2-methylphenyl)acetonitrile,
(5-n-octanesulfonyloxyimino-5H-thiophen-2-ylidene)(2-methylphenyl)acetonitrile, etc.

Also included are the oxime sulfonates described in U.S. Pat. No. 6,261,738 and JP-A 2000-314956, for example, 2,2,2-trifluoro-1-phenyl-ethanone oxime-O-methylsulfonate, 2,2,2-trifluoro-1-phenyl-ethanone oxime-O-(10-camphorylsulfonate), and 2,2,2-trifluoro-1-phenyl-ethanone oxime-O-(4-methoxyphenylsulfonate).

Also included are the oxime sulfonates described in JP-A 9-95479 and JP-A 9-230588 and the references cited therein, for example, α-(p-toluenesulfonyloxyimino)-phenylacetonitrile,
α-(p-chlorobenzenesulfonyloxyimino)-phenylacetonitrile, and
α-(4-nitrobenzenesulfonyloxyimino)-phenylacetonitrile.

Suitable bisoxime sulfonates include those described in JP-A 9-208554, for example, bis(α-(4-toluenesulfonyloxy)imino)-p-phenylenediacetonitrile and bis(α-(benzenesulfonyloxy)imino)-p-phenylenediacetonitrile.

Also, the oxime sulfonates described in International Publication 2004/074242 are good acid generators providing a high sensitivity. Examples include CGI-1906, CGI-1311, CGI-1325, CGI-1380, CGI-1397, CGI-261, CGI-263 and CGI-268, commercially available from Ciba Speciality Chemicals.

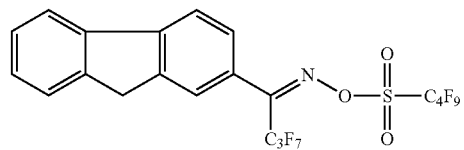
(CGI-1906)

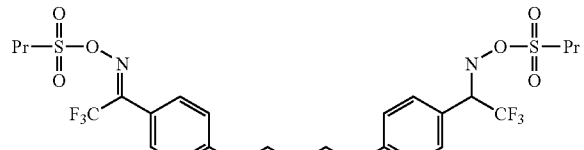
(CGI-263)

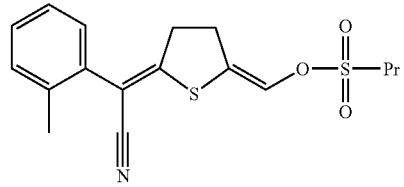
(CGI-1397)

Note that Pr is propyl.

Of the foregoing photoacid generators, sulfonium salts are preferred. As to the cation side, triphenylsulfonium, 4-methylphenyldiphenylsulfonium, 4-tert-butoxyphenyldiphenylsulfonium, 4-tert-butylphenyldiphenylsulfonium, tris(4-tert-butylphenyl)sulfonium, 4-alkoxynaphthyltetrahydrothiophenium, phenacyldiphenylsulfonium, and phenacyltetrahydrothiophenium are useful cations having a high sensitivity and acceptable stability. As to the anion side, perfluorobutanesulfonate, perfluorooctanesulfonate, perfluoro-4-ethylcyclohexanesulfonate and those sulfonates in which the carbon neighboring a sulfonyl group is fluorinated are preferred for higher resolution. An oxime sulfonate acid generator CGI-1906 by Ciba Speciality Chemicals is one preferred acid generator capable of providing a high sensitivity and high resolution.

In the resist composition of the invention, the photoacid generator is added in an effective amount, typically 0.3 to 10 parts, and preferably 0.5 to 5 parts by weight, per 100 parts by weight of the entire base resin, though not limited thereto. Excessive amounts of the photoacid generator may degrade resolution and give rise to a problem of foreign matter during development and resist peeling. The photoacid generators may be used alone or in admixture. It is also possible to use a photoacid generator having a low transmittance at the exposure wavelength in a controlled amount so as to adjust the transmittance of a resist film.

Nitrogen-Containing Compound (Basic Compound)

In the resist composition of the invention, one or more organic nitrogen-containing compound is compounded. The organic nitrogen-containing compound used herein is preferably a compound capable of suppressing the rate of diffusion when the acid generated by the acid generator diffuses within the resist film. The inclusion of this type of organic nitrogen-containing compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of organic nitrogen-containing compounds or basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives. As regards the basic compounds, a number of examples are described in JP-A 2003-510337, and they are applicable to the composition of the invention.

The organic nitrogen-containing compound is preferably formulated in an amount of 0.001 to 2 parts, and especially 0.01 to 1 part by weight, per 100 parts by weight of the entire base resin. Less than 0.001 part of the nitrogen-containing compound achieves no or little addition effect whereas more than 2 parts would result in too low a sensitivity.

Organic Solvent

An organic solvent is used in the resist composition of the invention. It may be any organic solvent in which the base resin, acid generator, and other components are soluble. Illustrative, non-limiting, examples of the organic solvent include ketones such as cyclohexanone and methyl 2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, or a mixture thereof because the acid generator is most soluble therein.

An appropriate amount of the organic solvent used is about 200 to 1,000 parts, especially about 400 to 800 parts by weight per 100 parts by weight of the solids in the resist composition.

Other Components

In the resist composition of the invention, there may be added a compound which is decomposed with an acid to generate another acid, that is, acid-amplifier compound. For these compounds, reference should be made to J. Photopolym. Sci. and Tech., 8, 43-44, 45-46 (1995), and ibid., 9, 29-30 (1996). Examples of the acid-amplifier compound include tert-butyl 2-methyl-2-tosyloxymethylacetoacetate and 2-phenyl 2-(2-tosyloxyethyl)-1,3-dioxolane, but are not limited thereto. Of well-known photoacid generators, many of those compounds having poor stability, especially poor thermal stability exhibit an acid-amplifier compound-like behavior. In the resist composition of the invention, an appropriate amount of the acid-amplifier compound is up to 2 parts, and especially up to 1 part by weight per 100 parts by weight of the entire base resin. Excessive amounts of the acid-amplifier compound makes diffusion control difficult, leading to degradation of resolution and pattern profile.

The resist composition of the invention may additionally include an acetylene alcohol derivative for the purpose of enhancing the shelf stability. Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K. All these are polyalkylene oxide alcohol derivatives having an acetylene skeleton within the molecule. The acetylene alcohol derivative is preferably added in an amount of 0.01 to 2% by weight, and more preferably 0.02 to 1% by weight of the resist composition. Less than 0.01% by weight would be ineffective for improving coating characteristics and shelf stability, whereas more than 2% by weight would result in a resist having a low resolution.

In the resist composition of the invention, there may be further included optional components such as surfactants for improving coating characteristics. Such optional components are added in any desired amounts insofar as the benefits of the invention are not impaired.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430 and FC-431 from Sumitomo 3M Co., Ltd., Surflon S-141 and S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dainippon Ink & Chemicals, Inc., and X-70-092 and X-70-093 from Shin-Etsu Chemical Co., Ltd. Preferred surfactants are Fluorad FC-430 from Sumitomo 3M Co., Ltd., KH-20, KH-30 from Asahi Glass Co., Ltd., and X-70-093 from Shin-Etsu Chemical Co., Ltd.

Patterning

Pattern formation using the resist composition of the invention may be carried out by a known lithographic technique. For example, the resist composition is applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for 30 seconds to 5 minutes. A patterning mask having the desired pattern is then placed over the resist film, and the film exposed through the mask to an electron beam or to high-energy radiation of up to 300 nm wavelength such as deep-UV, an excimer laser, or x-ray in a dose of about 1 to 200 mJ/cm$^2$, and preferably about 10 to 100 mJ/cm$^2$. The resist film is then post-exposure baked (PEB) on a hot plate at 60 to 150° C. for 10 seconds to 5 minutes, and preferably at 80 to 130° C. for 30 seconds to 3 minutes. Finally, development is carried out using as the developer an aqueous alkali solution, such as a 0.1 to 5% (preferably 2 to 3%) aqueous solution of tetramethylammonium hydroxide (TMAH), this being done by a conventional method such as dip, puddle, or spray method for a period of 5 seconds to 3 minutes, and preferably 15 seconds to 2 minutes. These steps result in the formation of the desired pattern on the substrate. Of the various types of high-energy radiation that may be used, the resist composition of the invention is best suited to fine pattern formation with, in particular, deep-UV having a wavelength of 254 to 120 nm, excimer lasers, specifically KrF laser (248 nm), ArF laser (193 nm), Kr$_2$ laser (146 nm), and KrAr laser (134 nm), lasers, specifically F$_2$ laser (157 nm) and Ar$_2$ laser (126 nm), x-ray, and electron beam. The invention is applicable to not only dry light exposure, but also light exposure by the immersion process.

By virtue of the synthesis method of SSQ condensate having a degree of condensation of 100% as the predominant component, the resist composition of the invention can use substituent groups having a high carbon ratio on the side chain as compared with silicon-containing resist compositions of the ordinary design. Then the resist composition of the invention can be used not only as the single-layer resist, but also advantageously as the upper layer in the bilayer resist process.

Described below is a method of processing a substrate using the resist composition according to the bilayer resist process. A substrate to be processed is usually an inorganic substrate. An underlying film to be described later is formed on the substrate. The resist composition of the invention is applied onto the underlying film to form a resist coating. If necessary, an antireflective coating may be formed between the resist coating and the underlying film. The resist coating is patterned by the above-mentioned procedure, after which the pattern is transferred to the underlying film by oxygen gas etching using the resist pattern as an etching mask. The oxygen gas etching is reactive plasma etching using oxygen gas as a main component. With this method, silicon oxide having high resistance to oxygen gas etching is formed from the resist pattern, allowing the underlying organic film to be processed at a high aspect ratio. $SO_2$, $CO_2$, CO, $NH_3$, or $N_2$ gas may be added to the oxygen gas for protecting side walls for preventing the film from being configured to a T-top profile by over-etching. Prior to the oxygen gas etching, brief etching with a fluorocarbon gas may be carried out for removing any scum of the resist after development and smoothening line edges to prohibit roughening.

A film or substrate to be processed is formed on a support substrate. The support substrate used herein is not particularly limited. For the support substrate, a choice may be made of Si, α-Si, p-Si, $SiO_2$, SiN, SiON, W, TiN, Al as long as the material is different from the patternable film. The patternable film may be a low-k film of Si, $SiO_2$, SiON, SiN, p-Si, α-Si, W, W—Si, Al, Cu, Al—Si or the like or a stopper film thereof, and typically has a thickness of 50 to 10,000 nm, especially 100 to 5,000 nm.

Subsequently, the patternable film is subjected to dry etching. Etching with a fluorocarbon gas as a main component is carried out when the patternable film is $SiO_2$ or $Si_3N_4$. Exemplary fluorocarbon gases are $CF_4$, $CHF_3$, $CH_2F_2$, $C_2F_6$, $C_3F_8$, $C_4F_{10}$ and $C_5F_{12}$. At the same time as the dry etching of the patternable film, the silicon-containing resist film can be stripped off. Etching with chlorine or bromine gas as a main component is employed when the patternable film is polysilicon, tungsten silicide, TiN/Al or the like.

In the bilayer resist process, the underlying film may be made of any organic material which is selected from a number of well-known organic film materials. As the organic film, aromatic resins are generally preferred, with those aromatic resins which can be crosslinked during film formation so as to prevent intermixing during coating and film formation of the resist composition thereon being especially preferred.

Suitable aromatic resins include novolac resins and polyhydroxystyrene resins. Aromatic resins further having a fluorene or indene skeleton are advantageously used to enhance the etching resistance of the organic film during etching of the substrate after the pattern has been transferred to the organic film. It is possible to form an antireflective coating on the organic film and to form a resist film of the invention thereon. If the organic film possesses an antireflective function, advantageously the overall process becomes simpler. To impart an antireflective function, an aromatic resin having an anthracene or naphthalene skeleton or a benzene skeleton with a conjugated unsaturated bond is preferably used.

Crosslinks can be formed by a crosslinking method as employed for thermosetting resins and negative resist compositions. In general, a composition solution comprising a resin having functional groups such as phenol, alkoxyphenyl, alcohol or carboxylic acid, a material capable of thermal decomposition to generate an acid, and a crosslinker capable of forming crosslinks with the functional groups in the presence of an acid catalyst, such as hexaalkoxymethylmelamine is applied onto a patternable substrate, and the coating is heated to generate an acid, with which crosslinks are formed.

EXAMPLE

Preparation Examples and Examples are given below together with Comparative Examples for further illustrating the invention although the invention is not limited thereby. All parts are by weight. The abbreviations used herein are Et for ethyl, Me for methyl, GPC for gel permeation chromatography, NMR for nuclear magnetic resonance, and Mw for weight average molecular weight. Units T1 to T3 are trifunctional silicon units (units T) and defined as follows, depending on the number of siloxane bonds.

T1: units with one siloxane bond formed (the remaining two are silanol groups or residual hydrolyzable groups),
T2: units with two siloxane bonds formed (the remaining one is a silanol group or residual hydrolyzable group), and
T3: units with three siloxane bonds formed (completely condensed units).

The T1/T2/T3 ratio designates a molar ratio of the respective units, determined by Si-NMR.

Preparation Example 1

A 100-ml flask was charged with 20 g of acetonitrile and 4.08 g of 2.37% oxalic acid solution, to which a solution of 3.01 g Monomer 1, 3.68 g Monomer 2, and 7.97 g Monomer 3 in 20 g acetonitrile was added dropwise over 5 hours. The solution was kept at 30° C. for 40 hours for reaction. At the end of reaction, the solution was diluted with methyl ethyl ketone and washed with deionized water until neutral. The solution was concentrated, obtaining 12.01 g of Hydrolyzate 1. This Hydrolyzate 1 had Mw=1,100 and a condensation ratio (T1/T2/T3) of 40/50/10.

Preparation Example 2

The procedure of Preparation Example 1 was repeated except that the monomer mixture used was a solution of 4.52 g Monomer 1, 3.68 g Monomer 2, and 6.90 g Monomer 4 in 20 g acetonitrile. There was obtained 12.53 g of Hydrolyzate 2. This Hydrolyzate 2 had Mw=1,200 and a condensation ratio (T1/T2/T3) of 40/55/5.

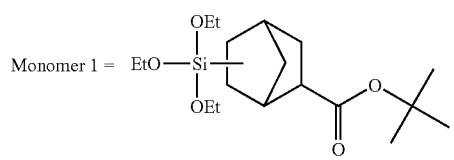

-continued

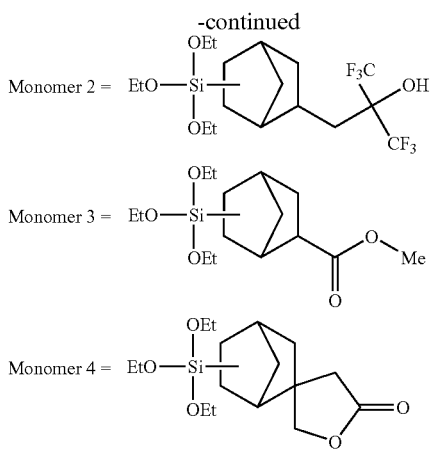

Herein Et is Ethyl group, and Me is methyl group.

Example 1

Hydrolyzate 1 synthesized in Preparation Example 1 was dissolved in 30 ml of dimethylformamide, to which 1.41 g (30 mol % relative to the monomer units) of potassium hydroxide was added, allowing reaction to occur at 140° C. for 24 hours. The reaction mixture was cooled, diluted with methyl isobutyl ketone, and repeatedly washed with deionized water until neutral. The condensate thus produced had a condensation ratio (T1/T2/T3) of 0/12/88 as a whole and contained 50% (calculated as area ratio by GPC, the same hereinafter) of cage-shaped octet having a degree of condensation of 100%. The amount of the condensate was 9.67 g.

FIG. 1 illustrates a GPC chart of the product.

Example 2

To a solution of Hydrolyzate 1 synthesized in Preparation Example 1 in methyl isobutyl ketone, 5.75 g of DBU was added, followed by refluxing for 24 hours in a flask equipped with an ester adapter. The water formed during the reaction was discharged out of the system through the ester adapter. After the reaction mixture was worked up as in Example 1, the resulting condensate had a condensation ratio (T1/T2/T3) of 0/5/95 as a whole and contained 77% of cage-shaped octet having a degree of condensation of 100%. The amount of the condensate was 9.57 g.

FIG. 1 also illustrates a GPC chart of this product.

Example 3

To a solution of Hydrolyzate 1 synthesized in Preparation Example 1 in methyl isobutyl ketone, 2.87 g of 40% tetramethylammonium hydroxide was added. Condensation reaction was effected for 24 hours while refluxing and removing water through an ester adapter. After the reaction mixture was worked up as in Example 1, the resulting condensate had a condensation ratio (T1/T2/T3) of 0/2/98 as a whole and contained 50% of cage-shaped octet having a degree of condensation of 100%. The amount of the condensate was 9.52 g.

FIG. 1 also illustrates a GPC chart of this product.

Example 4

Using Hydrolyzate 2 synthesized in Preparation Example 2, condensation reaction was effected according to the formulation of Example 1. After the reaction mixture was similarly worked up, the resulting condensate had a condensation ratio (T1/T2/T3) of 0/6/94 as a whole and contained 70% of cage-shaped octet having a degree of condensation of 100%. The amount of the condensate was 9.99 g.

Figure 2:
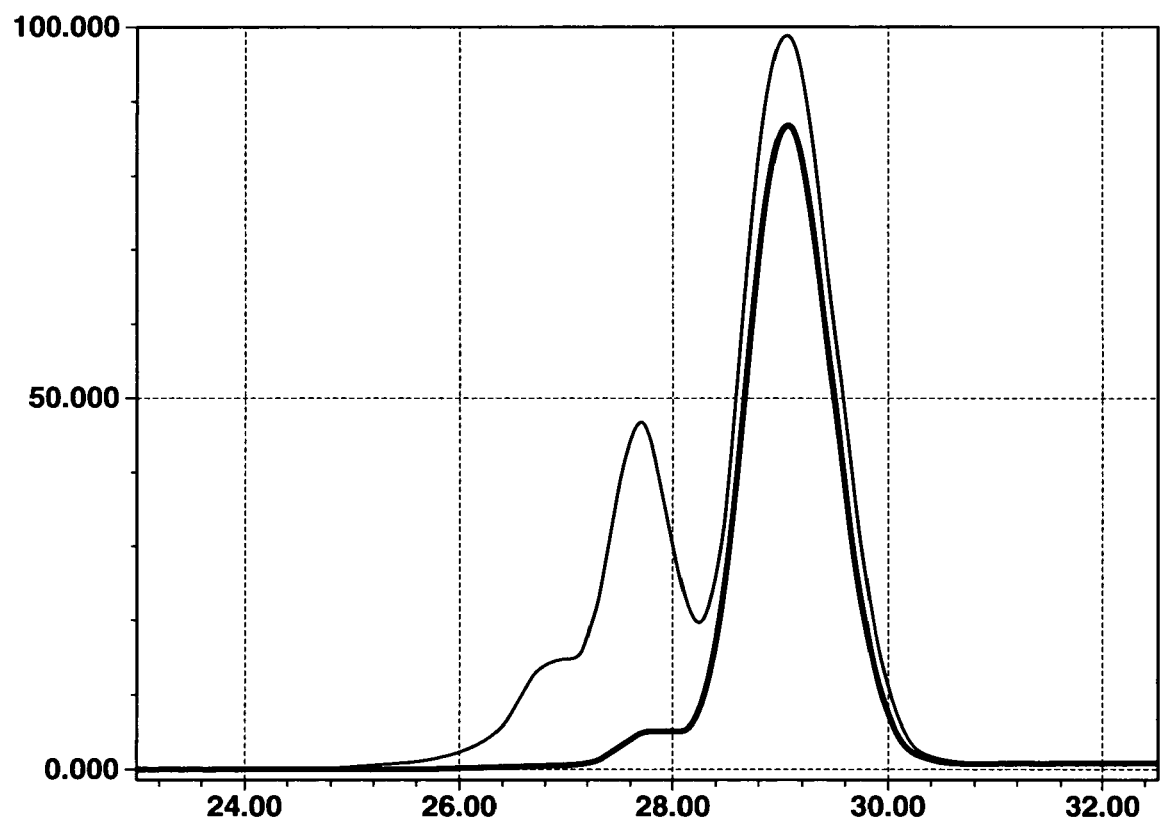
FIG. 2 illustrates GPC charts of the reaction condensate of Example 4 and a component isolated therefrom by GPC partition.
Figure 3:
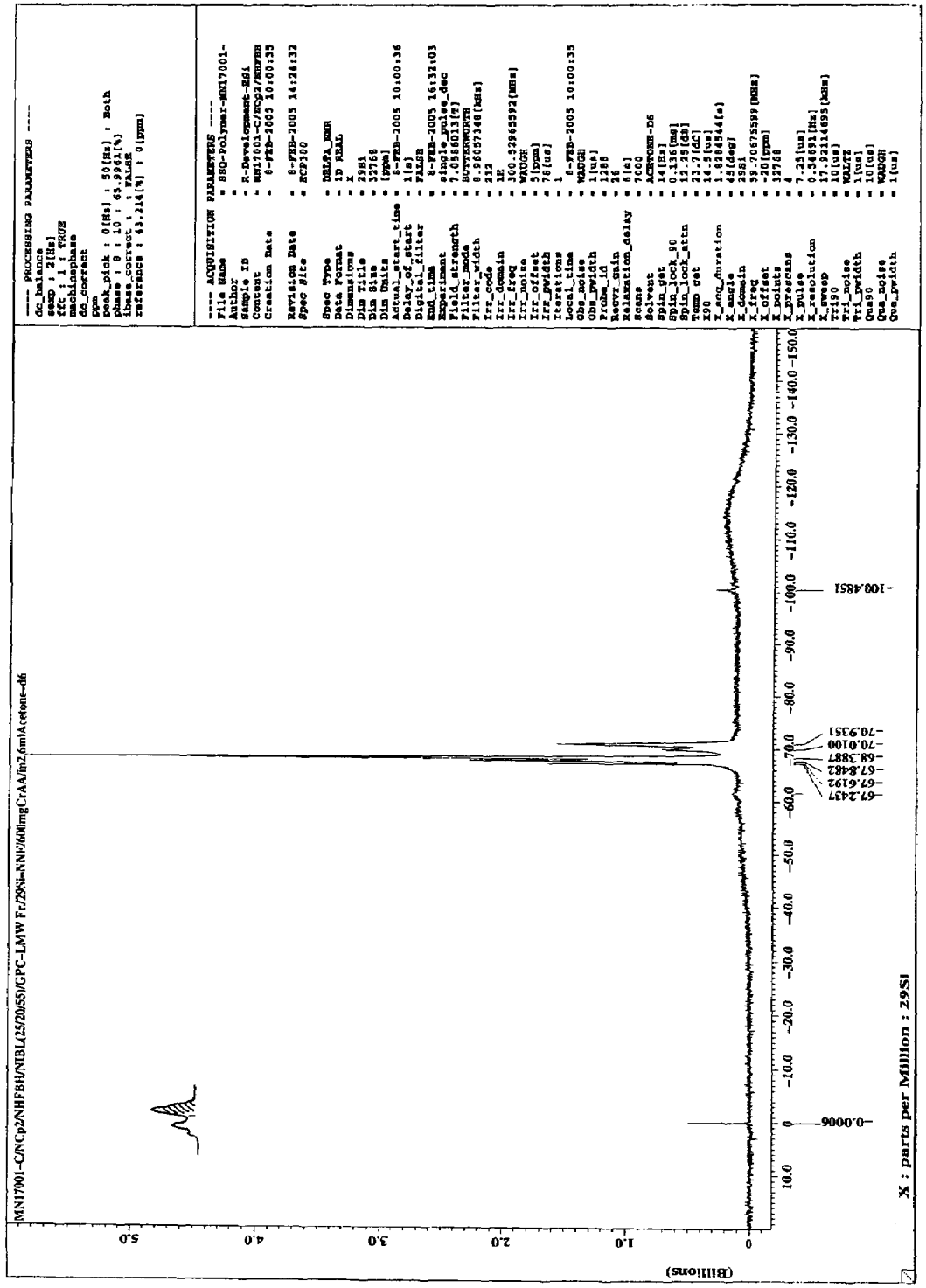
FIG. 3 is a Si-NMR chart of a component isolated from the reaction condensate of Example 4.

FIG. 2 illustrates GPC charts of the reaction mixture and a fraction thereof by GPC. FIG. 3 illustrates a Si-NMR spectrum of the cage-shaped octet having a degree of condensation of 100% as isolated by GPC partition

Comparative Example 1

To a solution of Hydrolyzate 1 synthesized in Preparation Example 1 in methyl isobutyl ketone, 18.21 g of triethylamine was added. Condensation reaction was effected at 110° C. for 24 hours. After working up as in Example 1, the reaction product had a condensation ratio (T1/T2/T3) of Feb. 35, 1963, with no cage-shaped octet having a degree of condensation of 100% produced. The amount of the condensate was 9.54 g.

Comparative Example 2

To a solution of Hydrolyzate 1 synthesized in Preparation Example 1 in dimethylformamide, 14.36 g of 40% tetramethylammonium hydroxide was added. Condensation reaction was effected at 110° C. for 24 hours. After working up as in Example 1, the condensate thus obtained was only 32%. It had a condensation ratio (T1/T2/T3) of 0/22/78, with no cage-shaped octet having a degree of condensation of 100% produced. The amount of the condensate was 3.31 g.

Comparative Example 3

This example followed the method of JP-A 2004-354417.

To a solution of Hydrolyzate 1 synthesized in Preparation Example 1 in 6 g of dimethylformamide, 0.75 g of 40% potassium hydroxide was added. Condensation reaction was effected at 140° C. for 16 hours. After working up as in Example 1, the condensate thus obtained had a condensation ratio (T1/T2/T3) of 0/8/82 and contained only 23% of cage-shaped octet having a degree of condensation of 100%. The amount of the condensate was 9.60 g.

Figure 4:
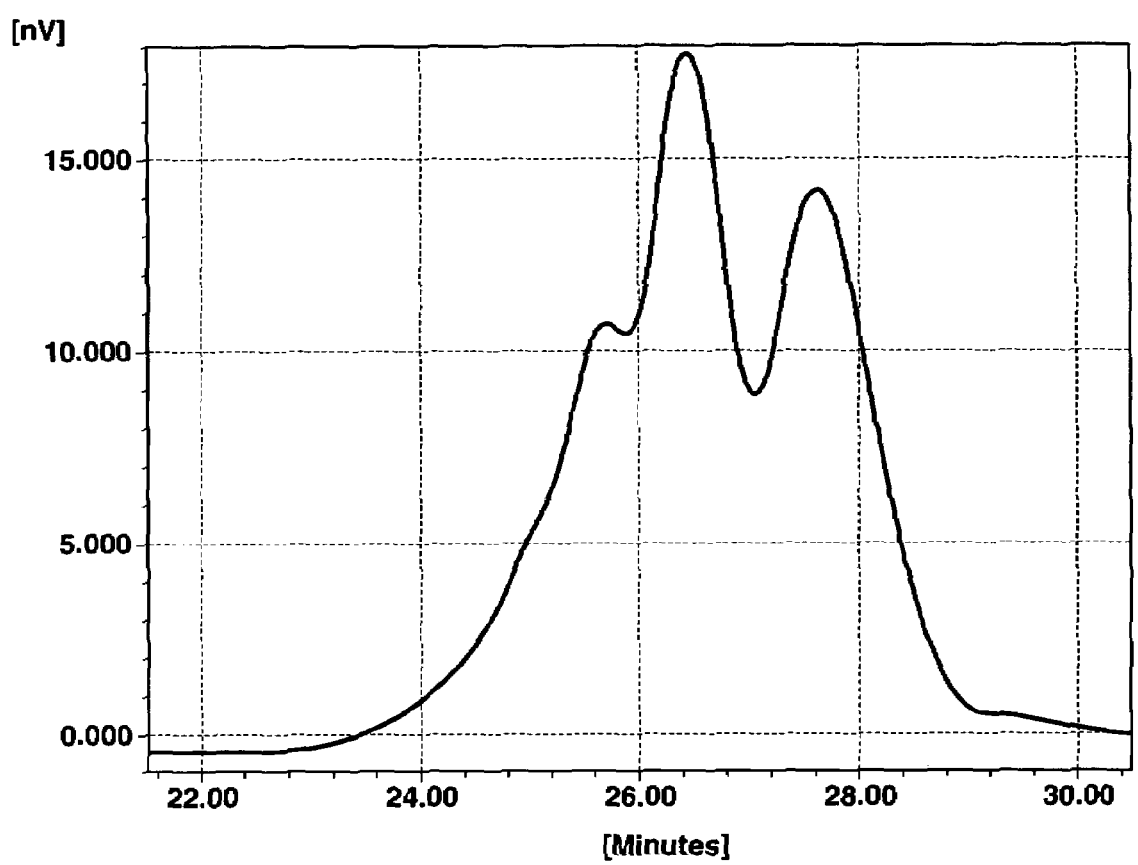
FIG. 4 illustrates a GPC chart of the reaction mixture of Comparative Example 3.

FIG. 4 illustrates a GPC chart of this product.

Example 5

A coating solution for forming positive resist film was prepared by dissolving 100 parts of the complete condensate mixture synthesized in Example 2 as a base polymer, 2 parts of a photoacid generator (triphenylsulfonium nonafluoro-n-butanesulfonate) and 0.1 part of a basic compound (triethanolamine) in 900 parts of a solvent (propylene glycol monomethyl ether acetate) and filtering through a filter with a pore size of 0.2 µm. Using a spin coater, the resist solution was applied to a silicon wafer having a 78-nm antireflective coating of ARC29A (Nissan Chemical Industries, Ltd.) formed thereon, and baked at 120° C. for 60 seconds to form a resist film of 160 nm thick. The resist film was exposed using an ArF excimer laser stepper NSR-S307E (Nikon Corporation; NA 0.85, σ0.93), then baked (PEB) at 100° C. for 60 seconds, and developed for 30 seconds with a 2.38 wt % aqueous solution of tetramethylammonium hydroxide (TMAH), thereby giving a positive pattern. The resist had a threshold resolution of 65 nm. It is noted that of the thus formed resist patterns, the minimum feature size of a pattern which is removed to the bottom and still maintains a desired profile is the threshold resolution.

Example 6

A resist composition was prepared as in Example 5 using the mixture containing cage-shaped octet having a degree of condensation of 100% synthesized in Example 3 as the base resin. It was similarly tested for resolution. The resist had a threshold resolution of 70 nm.

Comparative Example 4

A resist composition was prepared as in Example 5 using the complete condensate mixture synthesized in Comparative Example 3 as the base resin. It was similarly tested for resolution. The resist had a threshold resolution of 80 nm and a significantly narrow DOF margin.

Japanese Patent Application Nos. 2005-105783 and 2005 105795 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for preparing a mixture of silsesquioxane compounds having a high proportion of silsesquioxane compounds bearing bulky substituent groups on side chain and having a degree of condensation of substantially 100%, said method comprising:

a first stage wherein a silane feed is hydrolyzed in the presence of an acid or base catalyst, said silane feed comprising a trifunctional silane bearing a bulky substituent group on side chain represented by the general formula (1):

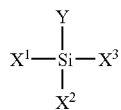

(1)

wherein Y is an organic group of 3 to 20 carbon atoms, optionally having a functional group, containing an aliphatic branched, cyclic or polycyclic structure in which the atom at the silicon-bonding site is a carbon having at least two bonds with atoms other than hydrogen and halogen atoms in addition to said silicon, or an organic group of 6 to 18 carbon atoms, optionally having a functional group, containing an aromatic structure having a substituent group other than hydrogen and halogen atoms at a site neighboring the silicon-bonding site; $X^1$, $X^2$ and $X^3$ are each independently a hydrogen atom, halogen atom, straight, branched or cyclic alkoxy group of 1 to 6 carbon atoms, or aryloxy group of 6 to 10 carbon atoms, and a second stage wherein dehydrating condensation reaction is carried out in the presence of at least 0.5 mol % based on the silane feed of a strong base catalyst while removing the water resulting from condensation out of the reaction system.

2. The method of claim 1 wherein an organic solvent is used in the second stage of dehydrating condensation in the presence of a strong base catalyst.

3. A method for preparing a mixture of silsesquioxane compounds having a high proportion of silsesquioxane compounds bearing bulky substituent groups on side chain and having a degree of condensation of substantially 100%, said method comprising:

a first stage wherein a silane feed is hydrolyzed in the presence of an acid or base catalyst, said silane feed comprising a trifunctional silane bearing a bulky substituent group on side chain represented by the general formula (1):

wherein Y is an organic group of 3 to 20 carbon atoms, optionally having a functional group, containing an aliphatic branched, cyclic or polycyclic structure in which the atom at the silicon-bonding site is a carbon having at least two bonds with atoms other than hydrogen and halogen atoms in addition to said silicon, or an organic group of 6 to 18 carbon atoms, optionally having a functional group, containing an aromatic structure having a substituent group other than hydrogen and halogen atoms at a site neighboring the silicon-bonding site; $X^1$, $X^2$ and $X^3$ are each independently a hydrogen atom, halogen atom, straight, branched or cyclic alkoxy group of 1 to 6 carbon atoms, or aryloxy group of 6 to 10 carbon atoms, and a second stage wherein dehydrating condensation reaction is carried out in the presence of at least 0.5 mol % based on the silane feed of a strong base catalyst using an organic solvent in an amount of at least two times the weight of hydrolyzates resulting from hydrolysis while allowing the water resulting from condensation to transfer to the organic solvent.

4. The method of claim 2 wherein the organic solvent used in the second stage of dehydrating condensation in the presence of a strong base catalyst is one which is separable from water.

5. The method of claim 1, further comprising the step of removing by fractionation a low condensed component from the reaction mixture obtained in the second stage of dehydrating condensation.

6. The method of claim 5 wherein the fractionation is by re-precipitation, column partition or GPC partition.

* * * * *